United States Patent
Sakakura et al.

(10) Patent No.: US 7,378,157 B2
(45) Date of Patent: May 27, 2008

(54) GAS BARRIER FILM, AND DISPLAY SUBSTRATE AND DISPLAY USING THE SAME

(75) Inventors: Osamu Sakakura, Tokyo-To (JP); Minoru Komada, Tokyo-To (JP); Shinya Sato, Tokyo-To (JP)

(73) Assignee: Dai Nippon Printing Co., Ltd., Shinjuku-Ku (JP)

( * ) Notice: Subject to any disclaimer, the term of this patent is extended or adjusted under 35 U.S.C. 154(b) by 285 days.

(21) Appl. No.: 11/166,773

(22) Filed: Jun. 24, 2005

(65) Prior Publication Data
US 2006/0093758 A1 May 4, 2006

(30) Foreign Application Priority Data
Jun. 28, 2004 (JP) .............................. 2004-189153
Jun. 28, 2004 (JP) .............................. 2004-189154

(51) Int. Cl.
*B32B 27/36* (2006.01)
(52) U.S. Cl. ...................................... 428/451; 428/480
(58) Field of Classification Search ................ 428/451, 428/480
See application file for complete search history.

(56) References Cited

U.S. PATENT DOCUMENTS

| 5,440,446 A | * | 8/1995 | Shaw et al. | ............... 361/301.5 |
| 7,229,703 B2 | * | 6/2007 | Kawashima et al. | ........ 428/690 |
| 2002/0022156 A1 | * | 2/2002 | Bright | ........................ 428/698 |

* cited by examiner

*Primary Examiner*—D. S Nakarani
(74) *Attorney, Agent, or Firm*—Burr & Brown (57) ABSTRACT

A gas barrier film, a display substrate and a display using the gas barrier film. The gas barrier film includes a base material film having a deflection temperature under load of 150° C. or above, and at least a gas barrier layer and a smoothing layer in that order, or a smoothing layer and a gas barrier layer in that order provided on the base material film. Preferably, the base material film is polyethylene naphthalate, the gas barrier layer is formed of an inorganic oxide, an inorganic oxynitride, an inorganic oxycarbide, or an inorganic oxycarbonitride, and the smoothing layer formed of a cardo polymer, sol-gel, or a material containing an acryl structure.

16 Claims, 2 Drawing Sheets

GAS BARRIER FILM, AND DISPLAY SUBSTRATE AND DISPLAY USING THE SAME

TECHNICAL FIELD

The present invention relates to a gas barrier film and more particularly to a gas barrier film, which is suitable, for example, for display substrates or display covering applications, can withstand heat during processing or use, and has excellent gas barrier properties, and a display substrate and a display using the same.

The "ratio", "parts", "%", etc. as used herein in conjunction with formulation are by mass unless otherwise specified, and "/" represents the state of integral lamination.

"EL", "LCD", "PET", and "PEN" are abbreviation, functional expression, common name, or industrial term for "electroluminescence", "liquid crystal display", "polyethylene terephthalate", and "polyethylene naphthalate", respectively.

According to the definition of film and sheet in JIS K 6900, the sheet refers to a flat product that is thin and is generally small in thickness as compared with the length and width thereof, and the film refers to a thin flat product that is very small in thickness as compared with the length and width thereof and has an arbitrarily limited maximum thickness and is generally supplied as a roll. Accordingly, sheets having a particularly small thickness can be regarded as films. However, the boundary between the sheet and the film is not clear and cannot be clearly distinguished from each other without difficulties, and, thus, in the present specification, the "film" is defined as a term encompassing both thick and thin products, sheets and films.

BACKGROUND ART

At the present time, various types of displays are used, and the practical use of various types of displays is studied. All of these displays except for cathode-ray tube types aim at a reduction in thickness. Further, there is an-increasing demand for flexible types. To this end, studies have been made on the use of synthetic resin sheets or synthetic resin films instead of conventional glass substrates constituting displays. Furthermore, studies have also been made on display substrates that use a gas barrier film for external oxygen and water vapor shielding purposes.

In addition to mechanical strength, smoothness, gas barrier properties and the like, for example, heat resistance, moisture resistance and mechanical strength against heat, moisture and mechanical external force, for example, in the step of stacking various functional layers for imparting a function as a display to the synthetic resin film, or the step of forming a gas barrier layer for imparting gas barrier properties are required of synthetic resin films as a material for display substrates.

Conventional synthetic resin films, however, are much inferior to glass substrates in heat resistance or moisture resistance and thus unavoidably undergoes deformation, for example, in heating in the step of forming a metallic thin film by vapor deposition or the like, or in heating in the step of curing by heating after coating of a heat curable resin coating material, or unavoidably has poor chemical resistance, for example, undergoes deformation due to moisture absorption upon contact with an aqueous solution in the step of etching a metallic thin film or the step of developing a resist. The display or gas barrier film thus obtained suffers from problems with dimensional accuracy, for example, deteriorated flatness, delamination based on misregistration with the stacked metallic thin film, or deviation of dimension from the previously set dimension. Further, in displays such as LCDs and EL display panels, and organic electronic devices such as organic transistors, when the formed element comes into contact with moisture or oxygen, disadvantageously, performance is deteriorated, and troubles such as luminescence failure and circuit drive failure take place.

Accordingly, gas barrier films for use in display substrates, organic electronic device substrates, and displays are required to have the following properties: heat resistance of 150° C. or above and a coefficient of linear expansion of not more than 50 ppm for enhancing dimensional stability to a level that, for example, upon exposure to heat generated during processing or use or tension during heating, is less likely to cause deteriorated flatness and separation and is further less likely to cause elongation or deflection; and a ultrahigh level of gas barrier properties for avoiding a deterioration in performance upon contact of the formed element with moisture, oxygen or the like particularly in displays such as LCDs and EL display panels.

Main applications of the gas barrier film according to the present invention are not particularly limited to the above display substrates and may be used in any application where heat resistance and gas barrier properties are required. Such applications include packaging materials such as foods and pharmaceutical preparations, as well as touch panels, illumination film substrates, solar cell film substrates, circuit board film substrates, electronic papers, organic electronic devices such as organic transistors and the like.

A conventional gas barrier laminated film comprises a polymeric resin base material and a gas barrier film having a two-layer structure provided on the polymeric resin base material. The gas barrier film comprises two layers of an inorganic compound vapor deposited layer and a coating layer formed from a coating agent composed mainly of a water/alcohol mixed solution (see, for example, Japanese Patent Laid-Open No. 164591/1995).

Another conventional gas barrier laminated film comprises a polymeric resin base material and two layers provided on the polymeric resin base material. These two layers are an inorganic compound vapor deposited layer, and a coating layer formed from a coating agent comprising, as a main agent, a mixed solution composed of at least one metal alkoxide or its hydrolyzate and an isocyanate compound containing two or more isocyanate groups in its molecule and preferably containing a tin chloride, melamine, melamine resin, and formaldehyde (see, for example, Japanese Patent Laid-Open No. 268115/1995).

Further, the formation of a gas shielding layer on a transparent heat resistant base material by sputtering is also known (see, for example, Japanese Patent Laid-Open No. 222508/1999).

The films disclosed in all the above patent documents have water resistance and moisture resistance, have flexibility on a level that can withstand a certain level of deformation, and have gas barrier properties, but on the other hand, as described in the working examples, the oxygen permeability is about 1 cc/m$^2$·day·atm, and, at best, the water vapor permeability and the oxygen permeability are 0.1 g/m$^2$·day and about 0.3 cc/m$^2$·day·atm, respectively. Thus, these films are disadvantageously unsatisfactory for preventing deterioration of luminescent layers or the like, for example, in organic EL elements. Further, the above patent documents neither describe nor refer to heat resistance on a level of 150° C. or above, chemical resistance, and a low coefficient of linear expansion.

SUMMARY OF THE INVENTION

The present invention has been made with a view to solving the above problems of the prior art, and an object of the present invention is to provide a gas barrier film, which has heat resistance on a level of 150° C. or above, is less likely to cause elongation or deflection upon exposure to heat or the like during processing or use, that is, has a high level of dimensional stability and has high chemical resistance, that is, is less likely to deteriorate upon exposure to chemicals or the like during processing or use and thus can form a stable gas barrier layer, and, consequently, has a high level of gas barrier properties against water vapor, oxygen and the like, and to provide a display substrate, an organic electronic device substrate, and a display using the same.

In order to attain the above object, the gas barrier film according to one aspect of the present invention comprises a base material film having a deflection temperature under load of 150° C. or above, and at least a gas barrier layer and a smoothing layer in that order, or a smoothing layer and a gas barrier layer in that order provided on the base material film.

According to a second aspect of the present invention, in the gas barrier film, the base material film is formed of polyethylene naphthalate.

According to a third aspect of the present invention, in the gas barrier film, the gas barrier layer is formed of an inorganic oxide, an inorganic oxynitride, an inorganic oxycarbide, or an inorganic oxycarbonitride.

According to a fourth aspect of the present invention, in the gas barrier film, the smoothing layer comprises a cardo polymer.

According to a fifth aspect of the present invention, in the gas barrier film, the smoothing layer has an acryl structure.

According to a sixth aspect of the present invention, in the gas barrier film, the smoothing layer is a coating film of a coating composition using as starting materials at least a silane coupling agent containing an organic functional group and a hydrolyzable group and a crosslinkable compound containing an organic functional group reactive with the organic functional group contained in the silane coupling agent.

According to a seventh aspect of the present invention, in the gas barrier film according to the first aspect of the present invention, at least one stress relaxation layer is provided on at least one side of the base material film.

According to an eighth aspect of the present invention, in the gas barrier film according to the first aspect of the present invention, a transparent electrically conductive film is provided on the surface of the gas barrier layer or the smoothing layer.

According to a ninth aspect of the present invention, a display substrate is provided, comprising a gas barrier film according to the first aspect of the present invention.

According to a tenth aspect of the present invention, a display substrate is provided, and includes a transparent electrically conductive film provided on the surface of the gas barrier layer or the smoothing layer in the gas barrier film according to the first aspect of the present invention.

According to an eleventh aspect of the present invention, an auxiliary electrode layer is provided on the surface of the transparent electrically conductive layer in the display substrate according to the tenth aspect of the present invention.

According to a twelfth aspect of the present invention, a display is provided, comprising a display substrate according to the ninth aspect of the present invention.

According to a thirteenth aspect of the present invention, an organic EL element is provided, comprising a display substrate according to the ninth aspect of the present invention.

According to a fourteenth aspect of the present invention, a liquid crystal display device is provided, comprising a display substrate according to the ninth aspect of the present invention.

According to a fifteenth aspect of the present invention, a color filter is provided, comprising a display substrate according to the tenth aspect of the present invention.

According to a sixteenth aspect of the present invention, a display is provided, comprising a color filter according to the fifteenth aspect of the present invention.

According to a seventeenth aspect of the present invention, an organic EL element is provided, comprising a color filter according to the fifteenth aspect of the present invention.

The present inventors have made extensive and intensive studies and, as a result, have found that a combination of a resin film base material having a deflection temperature under load of 150° C. or above, particularly preferably a polyethylene naphthalate base material, with a smoothing layer and an inorganic thin film layer formed by a vacuum film formation method can simultaneously realize heat resistance and an ultrahigh level of gas barrier properties, can realize excellent adhesion between the polyethylene naphthalate base material and the inorganic thin film layer by virtue of heat resistance on a level of 150° C. or above and preferably a coefficient of linear expansion of not more than 50 ppm/K, can realize winding, is less likely to cause elongation or deflection upon exposure to heat or the like during processing or use, has a high level of dimensional stability, and, at the same time, is less likely to cause a deterioration upon exposure to chemicals during processing or use, and can realize stable film formation, that is, has good processability.

The first aspect of the present invention provides a gas barrier film that has heat resistance on a level of 150° C. or above and is less likely to cause elongation and deflection upon exposure to heat or the like during processing or use, that is, has a high level of dimensional stability and excellent gas barrier properties against water vapor, oxygen and the like.

The second aspect of the present invention provides a gas barrier film that has heat resistance on a level of 150° C. or above and a low coefficient of linear expansion and is less likely to cause elongation and deflection upon exposure to heat or the like during processing or use, that is, has a high level of dimensional stability, and has high chemical resistance, and, thus, is less likely to deteriorate upon exposure to chemicals or the like during processing or use and can realize stable gas barrier layer formation, and, thus, has excellent gas barrier properties against water vapor, oxygen and the like.

The third to the sixth aspects of the present invention provide gas barrier films that have excellent gas barrier properties against water vapor, oxygen and the like.

The seventh aspect of the present invention provides a gas barrier film that is free from warpage or distortion and has excellent gas barrier properties against water vapor, oxygen and the like.

The eighth aspect of the present invention provides a gas barrier film for a film substrate for touch panels, solar cells, circuit boards, electronic papers and the like.

The ninth and tenth aspects of the present invention provide display substrates that have heat resistance on a level of 150° C. or above and a low coefficient of linear expansion and is less likely to cause elongation and deflection upon exposure to heat or the like during processing or use, that is, having a high level of dimensional stability, and having high chemical resistance, and, thus, are less likely to deteriorate upon exposure to chemicals or the like during processing or use and can realize stable gas barrier layer formation, and, thus, have excellent gas barrier properties against water vapor, oxygen and the like.

The eleventh aspect of the present invention provides a display substrate that has better stability and a higher level of electrical conductivity.

The twelfth aspect of the present invention provides a display that has a high level of heat resistance, a high level of dimensional stability (a low coefficient of linear expansion), and a high level of chemical resistance, and has excellent gas barrier properties against water vapor, oxygen and the like.

The thirteenth aspect of the present invention provides an organic EL element having a long service life that has a high level of heat resistance, a high level of dimensional stability (a low coefficient of linear expansion), and a high level of chemical resistance, and has excellent gas barrier properties against water vapor, oxygen and the like.

The fourteenth aspect of the present invention provides a liquid crystal display device having the effects attained by the ninth to eleventh aspects of the present invention.

The fifteenth aspect of the present invention provides a color filter having the effects attained by the tenth aspect of the present invention.

The sixteenth aspect of the present invention provides a display having the effects attained by the fifteenth aspect of the present invention.

The seventeenth aspect of the present invention provides an organic EL element having the effects attained by the fifteenth aspect of the present invention. dr

DETAILED DESCRIPTION OF THE INVENTION

Figure 1:
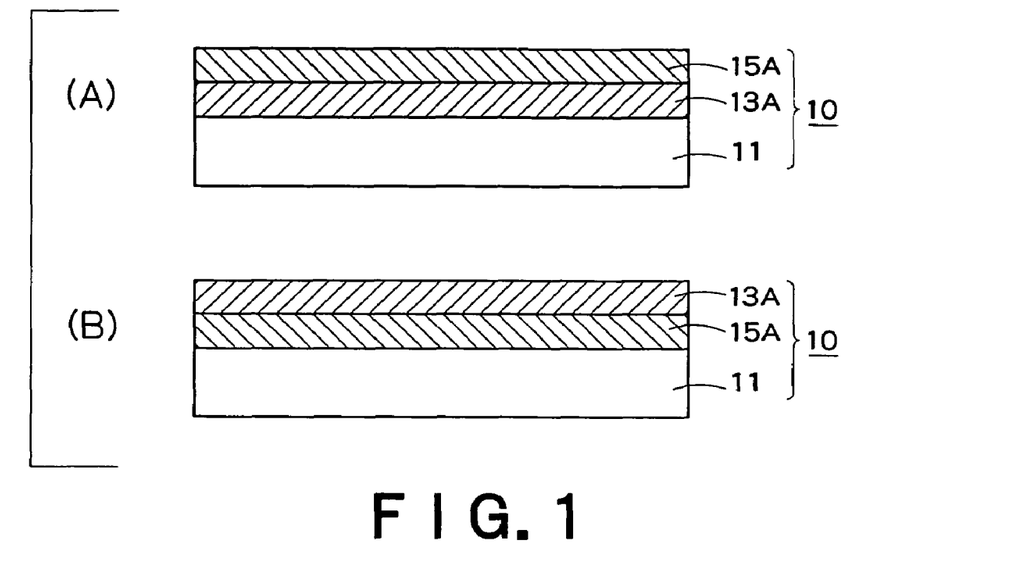
FIG. 1 is a cross-sectional view showing one embodiment of the gas barrier film according to the present invention.

As shown in FIG. 1(A), a gas barrier film 10 according to the present invention comprises a base material film 11 and a gas barrier layer 13A and a smoothing layer 15A provided on at least one side of the base material film 11, that is, has a layer construction of base material film 11/gas barrier layer 13A/smoothing layer 15A stacked in that order. Alternatively, as shown in FIG. 1(B), the gas barrier film 10 may have the same layer construction as in FIG. 1(A), except that the gas barrier layer 13A and the smoothing layer 15A are stacked in the reverse order as compared with FIG. 1(A), that is, a layer construction of base material film 11/smoothing layer 15A/gas barrier layer 13A. In any event, what is required here is to constitute a set of the gas barrier layer and the smoothing layer adjacent to each other.

Figure 2:
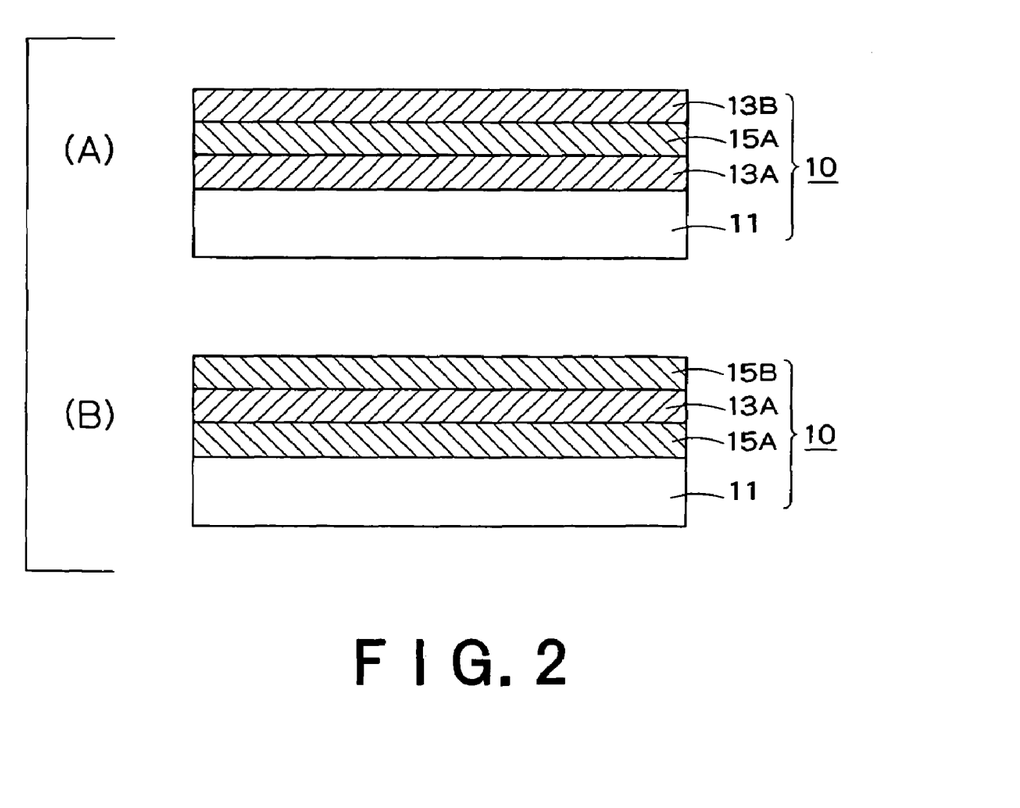
FIG. 2 is a cross-sectional view showing one embodiment of the gas barrier film according to the present invention.

Further, as shown in FIG. 2(A), an additional gas barrier layer may be provided on the surface of the smoothing layer to provide a layer construction of base material film 11/gas barrier layer 13A/smoothing layer 15A/gas barrier layer 13B. Alternatively, as shown in FIG. 2(B), an additional smoothing layer may be provided on the surface of the gas barrier layer to provide a layer construction of base material film 11/smoothing layer 15A/gas barrier layer 13A/smoothing layer 15B. Furthermore, gas barrier layer and/or smoothing layer may be additionally provided on the above layer constructions. That is, a set of the gas barrier layer and the smoothing layer adjacent to each other may be provided, and, further, a plurality of sets of the gas barrier layer and the smoothing layer adjacent to each other may be repeatedly stacked. This repeated stacking can significantly improve gas barrier properties.

Figure 3:
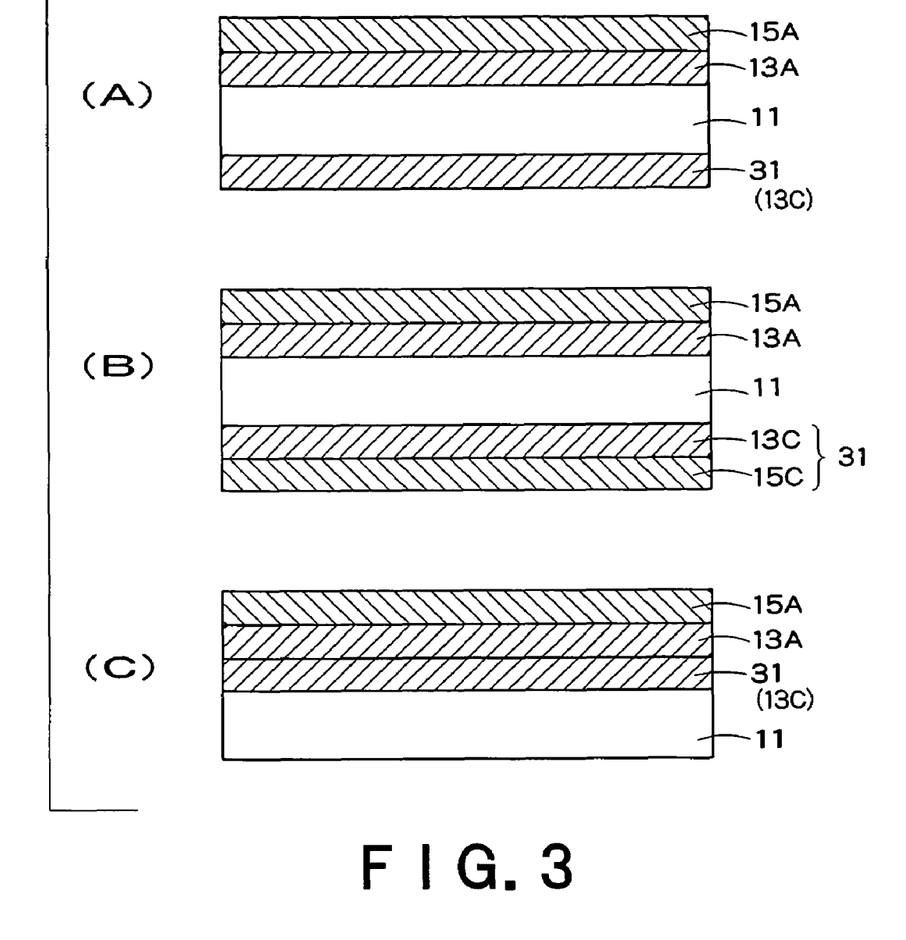
FIG. 3 is a cross-sectional view showing one embodiment of the gas barrier film according to the present invention.

In order to equally relax stress possessed by each layer, a symmetrical or nearly symmetrical layer construction is preferred. To this end, a stress relaxation layer is preferably provided on at least one side of the base material film to offset the layer stress. Specifically, FIG. 3(A) shows an embodiment of a nearly symmetrical layer construction. This layer construction is stress relaxation layer 31/base material film 11/gas barrier layer 13A/smoothing layer 15A. In this case, the gas barrier layer 13C is preferably used as the stress relaxation layer 31. According to this construction, stress relaxation and an improvement in gas barrier properties can be simultaneously realized. FIG. 3(B) shows an embodiment in which the layer construction on the front surface side and the layer construction on the back surface side are symmetrical. In this case, the layer construction is stress relaxation layer 31/base material film 11/gas barrier layer 13A/smoothing layer 15A which is the same layer construction as in FIG. 3(A), except that the stress relaxation layer 31 is constituted by two layers of gas barrier layer 13C/smoothing layer 15C for symmetrical layer construction. By virtue of the layer construction on the front surface side in a symmetrical relationship with the layer construction on the back surface side, a higher level of stress relaxation and improvement in gas barrier properties can be achieved. In the layer construction of base material film 11/stress relaxation layer 31/gas barrier layer 13A/smoothing layer 15A as an embodiment of an asymmetrical layer construction shown in FIG. 3(C), a gas barrier layer 13C with a varied stress state or the like may be used as the stress relaxation layer 31. In any event, the provision of a stress relaxation layer 31 having a single or multilayer structure possessing a stress relaxation function on at least one side of the base material film 11 suffices for contemplated results.

Figure 4:
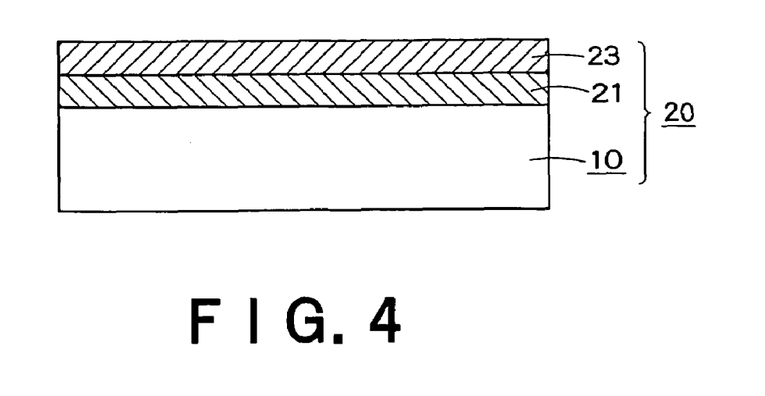
FIG. 4 is a cross-sectional view showing one embodiment of the display substrate according to the present invention.

Further, as shown in FIG. 4, a display substrate can be provided by providing a transparent electrode layer and optionally an auxiliary electrode layer and other layers on the surface of the smoothing layer or gas barrier layer.

That is, a set of gas barrier layer/smoothing layer or a set of smoothing layer/gas barrier layer is indispensable, and other layer(s) may be provided or held between layers other than the above set of layers.

Base Material Film

Thermal properties required of the base material film 11 may also be specified by the maximum continuous service temperature which is limited to 150° C. or above. For each resin, the maximum continuous service temperature is equal to the deflection temperature under load of each resin. Therefore, the base material film 11 is formed of a resin film that has a deflection temperature under load of 150° C. or above and more preferably has a coefficient of linear expansion of not more than 50 ppm/K. When the deflection temperature under load is below 150° C., the base material film 11 is likely to be softened by heat provided at the time of the formation of the gas barrier layer 13A on the base material film 11, and the base material film 11 is likely to be deformed by external force applied to the base material film 11. From the viewpoint of this, a higher deflection temperature under load is preferred. In the following specific embodiments, the deflection temperature under load is 300° C. or below. When the deflection temperature under load is above 300° C., the flexibility of the base material film per se is low and, thus, the softness is lost. Therefore, continuous processing is difficult.

Specific examples of preferred resin films constituting the base material film 11 include crystalline resins, for example, thermoplastic resins such as polyamide, polyacetal, polybutylene terephthalate, polyethylene terephthalate, polyethylenenaphthalate, or syndiotactic polystyrene; and heat curing resins such as polyphenylene sulfide, polyether ether ketone, liquid crystal polymers, fluororesins, or polyethernitrile. Examples of more preferred synthetic resins as the material constituting the base material film 11 include noncrystalline resins, for example, thermoplastic resins such as polycarbonate, modified polyphenylene ether, polycyclohexene, or polynorbornene; and heat curing resins such as polysulfone, polyethersulfone, polyallylate, polyamideimide, polyetherimide, or thermoplastic polyimide. Among them, polycarbonate has a low level of water absorption. Therefore, the base material film 11 formed of this resin has a low coefficient of moisture expansion and is particularly preferred.

The deflection temperature under load is specified in JIS K 7191 which is a more practical index as thermal properties, particularly behavior on external force required of the base material film 11. The deflection temperature under load of individual resins is, for example, as follows: polyethylenenaphthalate resin (PEN); 155° C., polycarbonate resin; 160° C., polyarylate resin; 175° C., polyether sulfone resin; 210° C., cycloolefin polymer (tradename; "ZEONOR", manufactured by Zeon Corporation); 150° C., or norbornene resin (tradename; "ARTON", manufactured by JSR Corporation); 155° C.

Polyester

The polyester constituting the film as the base material film 11 layer is preferably a linear saturated polyester synthesized from an aromatic dibasic acid or its ester forming derivative and a diol or its ester forming derivative. Some of general polyesters have a deflection temperature under load of 150° C. or below. The polyester as the base material film 11 layer referred to herein is a polyester having a deflection temperature under load of 150° C. or above. Specific examples of such polyesters include polyethylene terephthalate, polyethylene isophthalate, polyethylene isophthalate, polybutylene terephthalate, poly(1,4-cyclohexylenedimethylene terephthalate), and polyethylene-2,6-naphthalate. Copolymers of the above polyesters or blends of the above polyesters with a minor amount of other resins may also be used. Among these polyesters, polyethylene terephthalate and polyethylene-2,6-naphthalate are preferred from the viewpoint of good balance between mechanical properties and optical properties or the like. In particular, polyethylene-2,6-naphthalate is superior to polyethylene terephthalate, for example, in terms of larger mechanical strength, lower heat shrinkage, and a smaller amount of oligomer produced during heating. Further, polyethylene-2,6-naphthalate has high chemical resistance. Therefore, particularly, even in the case where a gas barrier layer is formed after a pattern layer is formed by a process including the step of etching, for example, by etching using a resist, advantageously, the surface of the polyethylene naphthalate resin film is less likely to undergo damage such as denaturation and a gas barrier film or the like can be stably formed. Consequently, excellent gas barrier properties can be advantageously imparted.

The polyester may be a homopolymer or a copolymer produced by copolymerization with a third component. Preferably, however, the polyester is a homopolymer. When the polyester is a polyethylene terephthalate, the copolymer is optimally isophthalic acid copolymerized polyethylene terephthalate. The isophthalic acid copolymerized polyethylene terephthalate preferably has an isophthalic acid content of not more than 5% by mole. The polyester may be copolymerized with a comonomer component other than isophthalic acid, or a comonomer alcohol component in such an amount that does not sacrifice the properties of the polyester, for example, in an amount of not more than 3% by mole based on the whole acid component or the whole alcohol component. Examples of such comonomer acid components or acid components usable for copolymerization include aromatic dicarboxylic acids such as phthalic acid and 2,6-naphthalenedicarboxylic acid; and aliphatic dicarboxylic acids such as adipic acid, azelaic acid, sebacic acid, and 1,10-decanedicarboxylic acid. Examples of alcohol components include aliphatic diols such as 1,4-butanediol, 1,6-hexanediol, and neopentyl glycol; and alicyclic diols such as 1,4-cyclohexanedimethanol. They may be used either solely or in a combination of two or more.

When the polyester is polyethylene-2,6-naphthalenedicarboxylate, a napthalenedicarboxylic acid is used as a main dicarboxylic acid component and ethylene glycol is used as a main glycol component. Examples of naphthalenedicarboxylic acids include 2,6-naphthalenedicarboxylic acid, 2,7-naphthalenedicarboxylic acid, and 1,5-naphthalenedicarboxylic acid. Among them, 2,6-naphthalenedicarboxylic acid is preferred. Here the term "main" refers to at least 90% by mole, preferably at least 95% by mole, of the whole repeating units in the constituents of the polymer as the component in the film according to the present invention.

Copolymer

When the polyester is a copolymer, the comonomer component constituting the copolymer may be a compound having two ester forming functional groups in its molecule. Examples of such compounds which may be preferably used include dicarboxylic acids such as oxalic acid, adipic acid, phthalic acid, sebacic acid, dodecanedicarboxylic acid, isophtalic acid, terephthalic acid, 1,4-cyclohexanedicarboxylic acid, 4,4'-diphenyldicarboxylic acid, phenylindanedicarboxylic acid, 2,7-naphthalenedicarboxylic acid, tetralindicarboxylic acid, decalindicarboxylic acid, and diphenyl ether dicarboxylic acid, oxycarboxylic acids such as p-hydroxy benzoic acid and p-hydroxyethoxy benzoic acid, propylene glycol, trimethylene glycol, tetramethylene glycol, hexamethylene glycol, cyclohexanemethylene glycol, neopentyl glycol, ethylene oxide adducts of bisphenol sulfone, ethylene oxide adducts of bisphenol A, or dihydric alcohols such as diethylene glycol and polyethyleneoxide glycol. These compounds may be used either solely or in a combination of two or more. Among them, isophtalic acid, terephthalic acid, 4,4'-diphenyldicarboxylic acid, 2,7-naphthalenedicarboxylic acid, and p-hydroxy benzoic acid are preferred acid components, and trimethylene glycol, hexamethylene glycol, neopentyl glycol, and ethylene oxide adducts of bisphenol sulfone are preferred glycol components.

Polyethylene-2,6-naphthalenedicarboxylate may be, for example, one in which a part or the whole of the terminal hydroxyl group and/or carboxyl group has been blocked by a monofunctional compound such as benzoic acid or methoxypolyalkylene glycol, or alternatively may be copolymerized with a tri- or higher functional ester forming compound such as glycerin or pentaerythritol in such a very small amount that a substantially linear polymer is obtained.

The polyester can be produced by a conventional method, and examples thereof include a method in which a polyester having a low degree of polymerization can be directly produced by reacting a dicarboxylic acid with a glycol, and a method in which a lower alkyl ester of a dicarboxylic acid is reacted with a glycol in the presence of a conventional transesterification catalyst, for example, one or at least two of compounds containing, for example, sodium, potassium, magnesium, calcium, zinc, strontium, titanium, zirconium, manganese, and cobalt, followed by polymerization in the presence of a polymerization catalyst. Polymerization catalysts usable herein include antimony compounds such as antimony trioxide and antimony pentoxide; germanium compounds typified by germanium dioxide; and titanium compounds such as tetraethyl titanate, tetrapropyl titanate, tetraphenyltitanate or partial hydrolyzates thereof, titanyl ammonium oxalate, titanyl potassium oxalate, and titanium trisacetyl acetonate.

When polymerization is carried out through the transesterification reaction, phosphorus compounds such as trimethylphosphate, triethylphosphate, tri-n-butylphosphate, or orthophosphoric acid are generally added to deactivate the transesterification catalyst before the polymerization. In this case, the content in terms of phosphorus element in polyethylene-2,6-naphthalenedicarboxylate is preferably 20 to 100 ppm by weight from the viewpoint of thermal stability of the polyester. After melt polymerization, the polyester may be brought to chips which are then subjected to solid phase polymerization under reduced pressure with heating or in a stream of an inert gas such as nitrogen.

Preferably, the polyester comprises not less than 90% by mole, preferably not less than 95% by mole, more preferably not less than 97% by mole, of ethylene terephthalate units or ethylene-2,6-carboxylate units. The intrinsic viscosity of the polyester is preferably not less than 0.40 dl/g, more preferably 0.40 to 0.90 dl/g. When the intrinsic viscosity is less than 0.40 dl/g, in some cases, breaking in process frequently occurs. On the other hand, when the intrinsic viscosity is higher than 0.9 dl/g, the melt viscosity is so high that melt extrusion is difficult. Further, in this case, a longer polymerization time is necessary, which is disadvantageously cost-ineffective. If necessary, the polyester may contain colorants, antistatic agents, antioxidants, organic lubricants, catalysts and the like.

Provision of Coating Layer

In the polyester film, when other layer is formed on at least one side of the base material film formed of a polyester, a coating layer may be provided to improve wettability with the layer (resulting in smoothing of the formed layer) and to improve adhesion to the layer. The coating layer is also called an adhesion promoting layer, a primer layer, an undercoat layer, an anchor coat layer or the like depending upon the purposes. This coating layer contains a polymer binder and fine particles, and the refractive index of the polymer binder is substantially identical to the refractive index of the fine particles. The expression "the refractive index is substantially identical" means that the difference in refractive index between the binder and the fine particles is not more than 0.04. The refractive index difference is more preferably not more than 0.02, still more preferably not more than 0.01, particularly preferably not more than 0.005. When the refractive index difference exceeds 0.04, light is significantly scattered due to the refractive index difference at the boundary between the polymer binder and the fine particles, resulting in increased haze value of the coating layer which causes deteriorated transparency.

Binder

The polymer binder is preferably a mixture of a polyester resin with an acrylic resin containing an oxazoline group and a polyalkylene oxide chain from the viewpoint of imparting good adhesion. The polymer binder is preferably soluble or dispersible in water. However, a polymer binder, which is soluble in water containing a small amount of an organic solvent, may also be preferably used. The polyester resin constituting the polymer binder may be a polyester produced from the following polybasic acid component and diol component. That is, polybasic components include, for example, terephthalic acid, isophthalic acid, phthalic acid, phthalic anhydride, 2,6-naphthalenedicarboxylic acid, 1,4-cyclohexanedicarboxylic acid, adipic acid, sebacic acid, trimellitic acid, pyromellitic acid, dimeric acid, and 5-sodium sulfoisophthalate. The polyester resin constituting the polymer binder is preferably a copolymerized polyester using two or more dicarboxylic acid components. The polyester resin may contain unsaturated polybasic components such as maleic acid and itaconic acid, and hydroxycarboxylic acid components such as p-hydroxy benzoic acid so far as the amount thereof is small. Diol components in the polyester resin include, for example, ethylene glycol, 1,4-butanediol, diethylene glycol, dipropylene glycol, 1,6-hexanediol, 1,4-cyclohexanedimethanol, xylene glycol, and dimethylol propane, or poly(ethylene oxide)glycol and poly(tetramethylene oxide)glycol.

The glass transition point of the polyester resin in the polymer binder is preferably 40 to 100° C., more preferably 60 to 80° C. When the glass transition point of the polyester resin is in this range, excellent adhesion and excellent scratch resistance can be provided. When the deflection temperature under load is below 40° C., blocking is likely to occur between films themselves. On the other hand, when the deflection temperature under load is above 100° C., the coating film is hard and is brittle, disadvantageously leading to deteriorated scratch resistance. The polymer binder in the coating layer generally has a refractive index in the range of 1.50 to 1.60.

Examples of oxazoline group- and polyalkylene oxide chain-containing acrylic resins which may be used as a constituent of the polymer binder include acrylic resins produced from the following oxazoline group-containing monomers and polyalkylene oxide chain-containing monomers. Oxazoline group-containing monomers include, for example, 2-vinyl-2-oxazoline, 2-vinyl-4-methyl-2-oxazoline, 2-vinyl-5-methyl-2-oxazoline, 2-isopropenyl-2-oxazoline, 2-isopropenyl-4-methyl-2-oxazoline, and 2-isopropenyl-5-methyl-2-oxazoline. They may be used either solely or as a mixture of two or more. Among them, 2-isopropenyl-2-oxazoline is suitable because of its good commercial availability. The use of the oxazoline group-containing acrylic resin can improve the force of coagulation of the coating layer and thus can further improve the adhesion between the coating layer and the hardcoat, pressure-sensitive adhesive layer or the like. Further, resistance to scratch by a metallic roll used in the film formation step and hardcoat processing step can be imparted.

Polyalkylene oxide chain-containing monomers include those in which polyalkylene oxide was added to the ester part in acrylic acid or methacrylic acid. Polyalkylene oxide chains include polymethylene oxide, polyethylene oxide, polypropylene oxide, and polybutylene oxide. The content of the repeating units of the polyalkylene oxide chain is preferably 3 to 100. When the polyalkylene oxide chain-containing acrylic resin is used, the compatibility between the polyester resin and the acrylic resin in the polymer binder of the coating layer is better than the compatibility using the polyalkylene oxide chain-free acrylic resin and, thus, the transparency of the coating layer can be improved. When the number of repeating units of the polyalkylene oxide chain is less than 3, the compatibility between the polyester resin and the acrylic resin is deteriorated and, thus, the transparency of the coating layer is deteriorated. On the other hand, when the number of repeating units exceeds 100, the resistance to moist heat of the coating layer is lowered, and, thus, adhesion to hardcoat or the like under high humidity and high temperature conditions is disadvantageously deteriorated.

Acrylic Resin

Acrylic resins may be copolymerized with the following monomers as other comonomer component. Such other comonomer components include, for example, alkyl acrylate and alkyl methacrylate (in which the alkyl group is, for example, a methyl, ethyl, n-propyl, isopropyl, n-butyl, isobutyl, t-butyl, 2-ethylhexyl, or cyclohexyl group); hydroxy-containing monomers such as 2-hydroxyethyl acrylate, 2-hydroxyethyl methacrylate, 2-hydroxypropyl acrylate, and 2-hydroxypropyl methacrylate; epoxy group-containing monomers such as glycidyl acrylate, glycidyl methacrylate, and allyl glycidyl ether; monomers containing a carboxy group(s) or its salt, such as acrylic acid, methacrylic acid, itaconic acid, maleic acid, fumaric acid, crotonic acid, styrenesulfonic acid and their salts (for example, sodium, potassium, ammonium, and tertiary amine salts); amide group-containing monomers such as acrylamide, methacrylamide, N-alkylacrylamide, N-alkylmethacrylamide, N,N-dialkylacrylamide, N,N-dialkylmethacrylate (in which the alkyl group is, for example, methyl, ethyl, n-propyl, isopropyl, n-butyl, isobutyl, t-butyl, 2-ethylhexyl, or cyclohexyl group), N-alkoxyacrylamide, N-alkoxymethacrylamide, N,N-dialkoxyacrylamide, N,N-dialkoxymethacrylamide (in which the alkoxy group is, for example, a methoxy, ethoxy, butoxy, or isobutoxy group), acryloyl morpholine, N-methylolacrylamide, N-methylolmethacrylamide, N-phenylacrylamide, and N-phenylmethacrylamide; acid anhydride monomers such as maleic anhydride and itaconic anhydride; and vinyl isocyanate, allyl isocyanate, styrene, α-methylstyrene, vinyl methyl ether, vinyl ethyl ether, vinyl trialkoxysilane, alkylmaleic acid monoester, alkylfumaric acid monoester, alkylitaconic acid monoester, acrylonitrile, methacrylonitrile, vinylidene chloride, ethylene, propylene, vinyl chloride, vinyl acetate, and butadiene.

The content of the polyester resin constituting the coating layer is preferably 5 to 95% by weight, particularly preferably 50 to 90% by weight. The content of the oxazoline group- and polyalkylene oxide chain-containing acrylic resin in the coating layer is preferably 50 to 90% by weight, particularly preferably 10 to 50% by weight. When the content of the polyester resin is more than 95% by weight or when the content of the oxazoline group- and polyalkylene oxide chain-containing acrylic resin is less than 5% by weight, the force of coagulation of the coating layer is lowered and, in some cases, the adhesion to the hardcoat or pressure-sensitive adhesive is disadvantageously unsatisfactory. When the acrylic resin is more than 90% by weight, the adhesion between the coating layer and the polyester film is lowered and, in some cases, the adhesion to the hardcoat or pressure-sensitive adhesive is disadvantageously unsatisfactory.

Fine Particles

Composite inorganic particles of silica and titania are preferred as the fine particles constituting the coating layer. For the composite inorganic particles of silica and titania, the refractive index can be regulated to any desired value, and this regulation can be easily carried out. The refractive index of the polymer binder is in the range of 1.50 to 1.60, and the refractive index of the fine particles can be easily regulated to the refractive index of the polymer binder. As with the polymer binder, the refractive index of the fine particles is also preferably in the range of 1.50 to 1.60. The average particle diameter of the fine particles is preferably in the range of 40 to 120 nm. When the average particle diameter of the fine particles is less than 40 nm, in some cases, satisfactory lubricity and scratch resistance cannot be obtained. On the other hand, when the average particle diameter is more than 120 nm, the particles are likely to fall off. Further, in this case, light scattering occurs, disadvantageously, resulting in lowered total light transmittance.

The content of the fine particles in the coating layer is preferably in the range of 0.1 to 10% by weight. When the content of the fine particles is less than 0.1% by weight, satisfactory lubricity and scratch resistance cannot be obtained. On the other hand, when the content of the fine particles is more than 10% by weight, the force of coagulation of the coating film is lowered and, thus, the adhesion is deteriorated, leading to light scattering which disadvantageously causes lowered total light transmittance.

Aliphatic Wax

The incorporation of aliphatic wax in the coating layer can impart lubricity to the surface of the film and thus is preferred. The content of the aliphatic wax is preferably 0.5 to 30% by weight, more preferably 1 to 10% by weight. When this content is less than 0.5% by weight, in some cases, disadvantageously the lubricity of the film surface is not obtained. On the other hand, when this content exceeds 30% by weight, in some cases, the adhesion of the coating layer to the polyester film base material and the easy adhesion to the hardcoat, pressure-sensitive adhesive or the like is disadvantageously unsatisfactory. Specific examples of aliphatic waxes include plant waxes such as carnauba wax, candelilla wax, rice wax, Japan wax, jojoba oil, palm wax, rosin-modified wax, ouricury wax, sugarcane wax, esparto wax, and bark wax; animal waxes such as beeswax, lanoline, spermaceti, insect wax, and shellac wax; mineral waxes such as montan wax, ozokerite, and ceresin wax; petroleum waxes such as paraffin wax, microcrystalline wax, and petrolactam; synthetic hydrocarbon waxes such as Fischer-Tropsch wax, polyethylene wax, polyethylene oxide wax, polypropylene wax and polypropylene oxide wax. Among them, carnauba wax, paraffin wax, and polyethylene wax are particularly preferred from the viewpoints of good easy adhesion to hardcoat, pressure-sensitive adhesive and the like and lubricity. They are preferably used in the form of a water dispersion because a reduction in environmental load and good handleability can be realized.

Additives

In order to further improve lubricity and scratch resistance, the coating layer may contain other fine particles in such an amount that is not detrimental to the transparency. Other fine particles usable herein include inorganic fine particles such as calcium carbonate, magnesium carbonate, calcium oxide, zinc oxide, magnesium oxide, silicon oxide, sodium silicate, aluminum hydroxide, iron oxide, zirconium oxide, barium sulfate, titanium oxide, tin oxide, antimony trioxide, carbon black, and molybdenum disulfide; and organic fine particles such as acrylic crosslinked polymers, styrene crosslinked polymers, silicone resins, fluororesins, benzoguanamine resins, phenolic resins, and nylon resins. For water insoluble solid materials among them, fine particles having a specific gravity of not more than 3 are preferably selected from the viewpoint of avoiding settling in the water dispersion.

Method for Film Formation

Any desired oriented polyester film may be formed, for example, by melting and extruding the above polyester into a film, cooling and solidifying the film on a casting drum to form an unstretched film, biaxially stretching the unstretched film at a temperature of Tg to (Tg+60)° C. in longitudinal direction and in a cross direction each by a factor of 2.0 to 5.0 and then heat setting the stretched film at a temperature of (Tm−100) to (Tm−5)° C. for 1 to 100 sec. Stretching may be carried out by a conventional method, for example, by a method using a roll or a method using a stenter. Stretching in the longitudinal direction can be carried out simultaneously with stretching in the cross direction. Alternatively, stretching in the longitudinal direction and stretching in the cross direction may be successively carried out. In the case of successive stretching, regarding the coating layer, an aqueous coating liquid is coated onto the monoaxially oriented film which has been stretched in one direction, and, in this state, the film is stretched in another direction and heat set. Coating method usable herein include roll coating, gravure coating, roll brushing, spraying, air knife coating, impregnation, and curtain coating. They may be used either solely or in a combination of two or more. Tg represents the glass transition temperature of the polymer, and Tm the melting point of the polymer.

Further, when relaxation treatment is carried out, heat treatment can be effectively carried out at a film temperature of (X−80) to X° C. wherein X represents heat setting temperature. Relaxation treatment methods include a method in which, in a period between the completion of heat setting and winding on a roll, at an intermediate position in the heat setting zone, both end parts of the film are cut off, and the film winding speed is made lower than the feed speed of the film, a method in which the film is heated with an IR heater between two transfer rolls different from each other in speed, a method in which the film is transferred onto a heating transfer roll and the speed of the transfer roll behind the heating transfer roll is lowered, a method in which, after heat setting, while transferring the film to above a nozzle through which hot air is blown, the winding speed of the film is made lower than the feed speed of the film, a method in which, after winding on a film forming machine, the film is transferred onto a heating transfer roll and the speed of the transfer roll is lowered, or a method in which, while transferring the film through a heating oven or a heating zone using an IR heater, the speed of the roll behind the heating zone is made lower than the speed of the roll before the heating zone. Any of the above methods can be used. In this case, preferably, the relaxation treatment is carried out in such a manner that the percentage deceleration of the speed on the winding side relative to the speed on the feed side is 0.1 to 10%.

Pattern Layer

Other layer, for example, a pattern layer may be provided on the base material film 11. The pattern layer is, for example, a single or plurality of types of color filter layers formed by patterning a resin film disposed on the base material film 11 to form a desired pattern, or a laminate of such color filter layer and a color conversion layer. The color filter layer is preferably formed in one type or a plurality of types in a pattern form to constitute a pixel. For example, a red color filter layer, a green color filter layer, a blue color filter layer, and a black matrix layer provided between individual color filter layers (pixels) are sometime formed. The pattern is generally formed by photolithography using a chemical such as an etching liquid. Therefore, the base material film should have chemical resistance. When the chemical resistance is low, the surface of the base material film undergoes damage such as denaturation. In this case, subsequently, a dense, high-adhesion gas barrier layer cannot be formed. Therefore, a high level of gas barrier properties cannot be developed.

On the other hand, when a resin having a deflection temperature under load of 150° C. or above and a coefficient of linear expansion of preferably not more than 50 ppm/K, preferably polyethylenenaphthalate (PEN) is used, by virtue of its excellent heat resistance and chemical resistance, it is possible to form a dense and high-adhesion layer which can realize a high level of gas barrier properties.

Gas Barrier Layer

The gas barrier layer 13A may be formed of any material so far as the material has gas barrier properties, and examples thereof include metals such as aluminum, nickel, chromium, iron, cobalt, zinc, gold, silver, and copper; semiconductors such as silicone, germanium, and carbon; inorganic oxides such as silicon oxide, aluminum oxide, magnesium oxide, indium oxide, calcium oxide, zirconium oxide, titanium oxide, boron oxide, zinc oxide, cerium oxide, hafnium oxide, and barium oxide; nitrides such as silicon nitride, aluminum nitride, boron nitride, and magnesium nitride; carbides such as silicon carbide; and sulfides. Further, an oxynitride as a composite of two or more compounds selected from the above compounds, and, further, a carbon-containing oxycarbide layer, inorganic carbonitride layer, inorganic oxycarbonitride or the like may also be used.

Preferred are inorganic oxides (MOx) such as aluminum oxide, silicon oxide, magnesium oxide, calcium oxide, zirconium oxide, and titanium oxide, inorganic nitrides (MNy), inorganic carbides (MCz), inorganic oxycarbides (MOxCz), inorganic carbonitrides (MNyCz), inorganic oxynitrides (MOxNy), and inorganic oxycarbonitrides (MOxNyCz). In this case, M is preferably a metal element such as Si, Al, Ti or the like. Further, for example, materials formed by addition of a metal, a semiconductor or the like to the above material or replacement with a metal, a semiconductor or the like, or mixtures of the above materials may also be used.

The thickness of the gas barrier layer 13A is not particularly limited so far as the layer thickness is useful as a gas leakage preventive layer (a gas barrier layer). Preferably, however, the thickness is 30 to 10000 angstroms, more preferably 70 to 8000 angstroms, still more preferably 100 to 5000 angstroms. Further, when the total light transmittance is not less than 70%, there is no need that the gas barrier layer 13A is colorless. When the layer thickness is less than 30 angstroms, the gas barrier properties as the display substrate are unsatisfactory. On the other hand, when the layer thickness is more than 10000 angstroms, the stress of the gas barrier layer per se is so large that the flexibility is deteriorated.

Method for Gas Barrier Layer Formation

The gas barrier layer 13A may be formed by any method without particular limitation. Preferably, however, vacuum deposition, sputtering, ion plating, HotWire-CVD, thermal CVD or plasma CVD are used for the gas barrier layer formation. The method may be selected by taking into consideration, for example, the type of the film forming material, the easiness of film formation, and the process efficiency. For example, vapor deposition is a method in which a material contained in a crucible is heated and evaporated, for example, by resistance heating, high frequency dielectric heating, or beam heating such as electron beams or ion beams to deposit the evaporated material onto a flexible base material (for example, a plastic film) to form a thin film. In this case, heating temperature and heating method vary depending, for example, upon materials, purposes and the like. Further, a reactive vapor deposition method which causes an oxidation reaction or the like may also be used. Further, sputtering is a method which comprises introducing a discharge gas (for example, argon) into a vacuum chamber, applying a high frequency voltage or a direct current voltage across the target and the fixible base material (for example, a plastic film) to plasmatize discharge gas, allowing the plasma to collide against a target, flying the target material, and depositing the target material onto a substrate to form a thin film. In some cases, reactive sputtering is used in which a reactive gas such as oxygen is introduced to cause an oxidation reaction. This is true of CVD.

Lamination

The gas leakage preventive function of the gas barrier film 10 according to the present invention is mainly derived from a flexible base material and an inorganic thin film. The gas barrier film 10 may further comprise, for example, a plastic film stacked on the inorganic thin film through a conventional adhesive. Adhesives usable herein include, for example, naturally occurring rubber, synthetic rubber, polyester, polyurethane, acrylic, and silicone adhesives, or mixtures thereof. Preferred are polyurethane, polyester, and polyisocyanate adhesives or mixtures thereof. The thicknss of the adhesive is preferably 0.5 to 20 μm, more preferably 0.5 to 10 μm. The plastic film to be stacked may be the same as that described in the base material film 11. The thickness of the plastic film is 5 to 500 μm, preferably 8 to 300 μm.

Smoothing Layer

The smoothing layer may be formed of any material such as a sol-gel material, a radiation curing resin, a heat curing resin, or a photoresist mateiral so far as the purpose of the smoothing layer is to flatten the surface. Preferably, the material has a gas barrier function or excellent coating properties. In order to improve coating properties, radiation curing resins are preferred. The smoothing layer may be formed, for example, by coating a resin which, upon exposure to ultraviolet light (UV) or electron beams (EB), causes a crosslinking polymerization reaction and consequently is converted to a three-dimensional polymer structure, that is, for example, an ionizing radiation curing resin with a reactive prepolymer, oligomer and/or monomer having a polymerizable unsaturated bond or epoxy group in its molecule being properly mixed therein, or a liquid composition prepared by optionally mixing a urethane, polyester, acrylic, butyral, vinyl or other thermoplastic resin in the above ionizing radiation curing resin in consideration of coatability and the like and bringing the mixture to a liquid state, by a well known coating method such as roll coating, Mayer bar coating, gravure coating, dip coating, die coating, slide coating, Pr three-roll reverse coating, and drying and curing the coating. The coverage of the smoothing layer is suitably about 0.5 to 15 $g/m^2$ on a solid basis. Ultraviolet light sources usable for curing include ultrahigh pressure mercury lamps, high pressure mercury lamps, low pressure mercury lamps, carbon arc lamps, black light fluorescent lamps, and metal halide lamps. The wavelength of the ultraviolet light may be in a wavelength region of 190 to 380 nm, and electron beam sources usable herein include various electron beam accelerators such as Cockcroft-Walton accelerators, van de Graaff accelerators, resonance transformer accelerators, insulated core transformer accelerators, linear accelerators, Dynamitron accelerators, and high-frequency accelerators.

Specific examples of suitable ionizing radiation curing resins include acrylate functional group-containing ionizing radiation curing resins, that is, ionizing radiation curing resins having an acrylic structure. When the hardness and heat resistance, solvent resistance, and scratch resistance of the coating film are taken into consideration, a structure having a high crosslinking density is preferred. Monomers suitable to this end include bi- or higher functional acrylate monomers, for example, ethylene glycol di(meth)acrylate, 1,6-hexanediol diacrylate, trimetylolpropane tri(meth)acrylate, pentaerythritol tri(meth)acrylate, dipentaerythritol penta(meth)acrylate, and dipentaerythritol hexa(meth)acrylate. In the above monomers, (meth)acrylate refers to acrylate and/or methacrylate. The above ionizing radiation curing resins can be satisfactorily cured upon exposure to electron beams. When ultraviolet irradiation for curing is contemplated, photopolymerization initiators, such as acetophenones, benzophenones, thioxanthones, benzoin, benzoin methyl ether, Michler's benzoyl benzoate, Michler's ketone, diphenyl sulfide, dibenzyl disulfide, diethyl oxide, triphenylbiimidazole, and isopropyl-N,N-dimethylaminobenzoate, and photosensitizers such as n-butylamine, triethylamine, and poly-n-butylphosphine may be used. These photopolymerization initiators and photosensitizers may be used either solely or as a mixture of two or more. The amount of the photopolymeization initiator and the photosensizer added is generally about 0.1 to 10 parts by weight based on 100 parts by weight of the ionizing radiation curing resin.

Sol-gel Method

In order to impart adhesion to the barrier layer, a sol-gel material using a sol-gel method which can form a coating film of the same material is also suitable as the material for the smoothing layer according to the present invention. The sol-gel method refers to a coating method and a coating film using a coating composition comprising at least an organic functional group- and hydrolyzable group-containing silane coupling agent and a crosslinkable compound containing an organic functional group reactive with the organic functional group in the silane coupling agent. Examples of organic functional group- and hydrolyzable group-containing silane coupling agents (hereinafter often referred to as simply as "silane coupling agent") include aminoalkyldialkoxysilane or aminoalkyltrialkoxysilane represented by general formula (a) disclosed in Japanese Patent Laid-Open No. 207130/2001.

(a)

wherein $A^1$ represents an alkylene group; $R^4$ represents a hydrogen atom, a lower alkyl group, or a group represented by general formula (b)

(b)

wherein $A^2$ represents a direct bond or an alkylene group, and $R^8$ and $R^9$ represent a hydrogen atom or a lower alkyl group;

$R^5$ represents a hydrogen atom or a lower alkyl group; $R^6$ represents an alkyl group having 1 to 4 carbon atoms, an aryl group, or an unsaturated aliphatic residue, provided that, when a plurality of $R^6$s are present in the molecule, they may be the same or different; $R^7$ represents a hydrogen atom, an alkyl group having 1 to 4 carbon atoms, or an acyl group and preferably represents a hydrogen atom, an alkyl group having 1 to 3 carbon atoms, or an acyl group; when a plurality of $R^7$s are present in the molecule, they may be the same or different; at least one of $R^4$, $R^5$, $R^8$ and $R^9$ represents a hydrogen atom; w is 0, 1, or 2; and z is an integer of 1 to 3, provided that w+z=3.

Specific examples of aminoalkyldialkoxysilanes or aminoalkyltrialkoxysilanes represented by formula (a) include N-β(aminoethyl)γ-aminopropyltrimethoxysilane, N-β(aminoethyl)γ-aminopropyltriethoxysilane, N-β(aminoethyl)γ-aminopropyltriisopropoxysilane, N-β(aminoethyl)γ-aminopropyltributoxysilane, N-β(aminoethyl)γ-aminopropylmethyldimethoxysilane, N-β(aminoethyl)γ-aminopropylmethyidiethoxysilane, N-β(aminoethyl)γ-aminopropylmethyldiisopropoxysilane, N-β(aminoethyl)γ-aminopropylmethyldibutoxysilane, N-β(aminoethyl)γ-aminopropylethyldimethoxysilane, N-β(aminoethyl)γ-aminopropylethyidiethoxysilane, N-β(aminoethyl)γ-aminopropylethyldiisopropoxysilane, N-β(aminoethyl)γ-aminopropylethyidibutoxysilane, γ-aminopropyltrimethoxysilane, γ-aminopropyltriethoxysilane, γ-aminopropyltriisopropoxysilane, γ-aminopropyltributoxysilane, γ-aminopropylmethyidimethoxysilane, γ-aminopropylmethyldiethoxysilane, γ-aminopropylmethyldiisopropoxysilane, γ-aminopropylmethyldibutoxysilane, γ-aminopropylethyldimethoxysilane, γ-aminopropylethyldiethoxysilane, γ-aminopropylethyldiisopropoxysilane, γ-aminopropylethyldibutoxysilane, and γ-aminopropyltriacetoxysilane. They may be used either solely or in a combination of two or more.

The crosslinkable compound containing an organic functional group reactive with the organic functional group in the silane coupling agent (hereinafter often referred to simply as "crosslinkable compound") contains a functional group reactive with an amino group, for example, a glycidyl, carboxyl, isocyanate, or oxazoline group. Specific examples thereof include diglycidyl ethers such as ethylene glycol diglycidyl ether, diethylene glycol diglycidyl ether, triethylene glycol diglycidyl ether, tetraethylene glycol diglycidyl ether, nonaethylene glycol diglycidyl ether, propylene glycol diglycidyl ether, dipropylene glycol diglycidyl ether, tripropylene glycol diglycidyl ether, 1,6-hexanediol diglycidyl ether, neopentylglycol diglycidyl ether, adipic acid diglycidyl ether, orthophthalic acid diglycidyl ether, and glycerol diglycidyl ether; triglycidyl ethers such as glycerol triglycidyl ether, diglycerol triglycidyl ether, triglycidyl tris(2-hydroxyethyl)isocyanurate, and trimethylolpropane triglycidyl ether; tetraglycidyl ethers such as pentaerythritol tetraglycidyl ether; other polyglycidyl ethers, or polymers having a glycidyl group as a functional group; dicarboxylic acids such as tartaric acid and adipic acid; carboxyl-containing polymers such as polyacrylic acid; isocyanates such as hexamethylene diisocyanate and xylylene diisocyanate; oxazoline-containing polymers; and alicyclic epoxy compounds. They may be used either solely or in a combination of two or more. However, compounds containing two or more glycidyl groups are preferred from the viewpoint of reactivity.

The amount of the crosslinkable compound used is preferably 0.1 to 300% (by mass; the same shall apply hereinafter), more preferably 1 to 200%, based on the silane coupling agent. When the amount of the crosslinkable compound used is less than 0.1%, the flexibility of the coating film is unsatisfactory. On the other hand, when the amount of the crosslinkable compound used exceeds 300%, the gas barrier properties are likely to be deteriorated. The silane coupling agent and the crosslinkable compound are stirred optionally with heating to prepare a coating composition. When the coating composition using the silane coupling agent and the crosslinkable compound as raw materials is coated onto the thin film layer 4 to form a coating which is then dried, the hydrolysis and condensation of the silane coupling agent and crossliking by the crosslinkable compound proceed to form a polysiloxane coating film having a crosslinked structure.

The above composition may further contain a silane compound containing a hydrolyzable group and free from an organic functional group such as an amino group, and specific examples thereof include tetramethoxysilane, tetraethoxysilane, tetraisopropoxysilane, tetrabutoxysilane, methyltrimethoxysilane, methyltriethoxysilane, methyltriisopropoxysilane, methyltributoxysilane, ethyltrimethoxysilane, ethyltriethoxysilane, ethyltriisopropoxysilane, ethyltributoxysilane, dimethyldimethoxysilane, dimethyldiethoxysilane, dimethyldiisopropoxysilane, dimethyldibutoxysilane, diethyldimethoxysilane, diethyldiethoxysilane, diethyidiisopropoxysilane, diethyldibutoxysilane, vinyltrimethoxysilane, vinyltriethoxysilane, γ-glycidepropyltrimethoxysilane, γ-glycidepropyltriethoxysilane, γ-methacryloxypropyltrimethoxysilane, γ-chloropropyltrimethoxysilane, and γ-mercaptopropyltrimethoxysilane. They may be used either solely or in a combination of two or more.

When the composition contains the above silane compound containing a hydrolyzable group and free from an organic functional group such as an amino group, cohydrolysis and condensation between the organic functional group such as an amino group and the hydrolyzable group-containing silane coupling agent and the crosslinking by the crosslinkable compound proceed to form a polysiloxane coating film having a crosslinked structure. The coating composition may further contain a (co)hydrolyzed condensate of a silane coupling agent containing an organic functional group such as an amino group and containing a hydrolyzable group and/or a silane compound containing a hydrolyzable group and free from an organic functional group such as an amino group. In addition, the coating composition may optionally contain inorganic and organic various additives, such as silane compounds other than mentioned above, solvents, curing catalysts, wettability improvers, plasticizers, antifoaming agents, and thickening agents.

Cardo Polymer

Preferably, a cardo polymer is contained as the material for the smoothing layer. The cardo polymer is a polymer having the following cardo structure and is synthesized from a monomer having a cardo structure and other polymerizable monomer. Examples of cardo polymers include cardo polyester polymers, cardo acrylic polymers, and cardo epoxy polymers. Among them, cardo epoxy polymers are preferred. The use of a cardo polymer as a main component suffices for the smoothing layer. The smoothing layer may optionally contain additives such as plasticizers, fillers, antistatic agents, lubricants, antiblocking agents, antioxidants, ultraviolet absorbers, and photostabilizers, and, further, modifying resins.

The cardo polymer has a unique structure, i.e., a cardo structure, in the polymer in its main chain structure. The cardo structure has a number of aromatic rings, and, due to steric hindrance derived from the presence of these aromatic rings, the fluorene structure part and the main chain direction are in a twisted positional relationship. For this reason, in the carbon atom part located at the center, the bond angle can be changed relatively freely. Accordingly, it is considered that, despite high strength and toughness, the cardo polymer is not fragile particularly at low temperatures and, at the same time, has high hardness and scratch resistance. Further, the cardo polymer-containing layer has good leveling properties and thus can fill and cover defects, resulting in smoother surface after drying. Furthermore, the cardo polymer has good affinity for and wettability by an inorganic compound, for example, in the gas barrier layer 13A in the present invention and, thus, can fill, cover and clog defects such as pores, concaves, and cracks. Therefore, the synergistic effect of the affinity and the leveling properties can develop an ultrasmoothing function, and, thus, smoothing, that is, a significant lowering in Ra and Rmax of the surface, can be realized. Thus, when the surface smoothness is enhanced, gas permeation proceeds as follows: adsorption of gas on the surface of the material, dissolution in the material, diffusion in the material, and dissipation to the opposite surface. Therefore, adsorption sites (surface area), for example, for oxygen or water vapor or moisture can be reduced, and, thus, adsorption on the surface in the first stage can be significantly reduced, leading to significantly improved gas barrier properties.

Multilayer Construction

As described above, multilayer constructions may be adopted including a layer construction of base material film 11/gas barrier layer 13A/smoothing layer 15A/gas barrier layer 13B/other layer and a layer construction of base material film 11/smoothing layer 15A/gas barrier layer 13A/ smoothing layer 15B/other layer. Regarding the layer construction, what is required is to have at least one set of gas barrier layer/smoothing layer or smoothing layer/gas barrier layer in which the material for the gas barrier layer and the material for the smoothing layer are those as described above. Materials for layers other than this set of gas barrier layer and the smoothing layer may have the above or similar function, or alternatively all the material may be of course as described above.

Stress Relaxation Layer

At least one stress relaxation layer 31 may be provided on at least one side of the base material film 11. Specifically, the stress relaxation layer 31 may be a (approximately symmetrical) stress relaxation layer 31 (gas barrier layer 13C) shown in FIG. 3(A), a (front side/backside symmetrical) stress relaxation layer 31 (having a two layer structure of gas barrier layer 13C/smoothing layer 15C) shown in FIG. 3 (B), and a (asymmetrical) stress relaxation layer 31 (gas barrier layer 13C) shown in FIG. 3(C). In order to uniformly relax the film stress, a symmetrically or approximately symmetrical layer construction is preferred. The stress relaxation layer 31 is in a back stress relationship with the gas barrier layer 13C and is preferably formed of an optical anisotropy-free material. Examples of such materials include materials as used in the gas barrier layer 13A and the smoothing layer 15A, or materials having functions similar to these materials, for example, ultraviolet curing resins such as hard coating resins.

In forming the gas barrier film 10 according to the present invention, that is, in forming a plurality of layers such as a gas barrier layer 13, a smoothing layer 15, and optionally a stress relaxation layer 31 onto the base material film 11, all the processing steps may be carried out in a continuous web (called winding by a person having ordinary skill in the art) (hereinafter referred to as "winding processing"). Winding processing machines for the gas barrier film 10 include, for example, winding-type sputtering devices, CVD devices, and ion plating devices, exemplified, for example, in Japanese Patent Laid-Open No. 149407/2003. Further, also for coating of the smoothing layer and the stress relaxation layer, as disclosed, for example, in Japanese Patent Laid-Open No. 18339/2002, conventional winding-type gravure coating, Komma coating, dip coating, die coating, slide coating, three-roll reverse coating, two-roll reverse coating and the like may be used. Further, also in pretreatment and post treatment, the same winding-type treatment as described above is possible, and, for example, a web-like heating device exemplified, for example, in Japanese Patent Laid-Open Nos. 52474/1993 and 64740/1993 may be used. Furthermore, also in the formation of, for example, a transparent electrode layer and optionally an auxiliary electrode layer and an organic EL function layer, which will be described later, and a color filter using the gas barrier film 10 according to the present invention, a winding processing machine may be used in a winding form. The winding processing is easy in setup, can be carried out in a continuous manner, can realize high production efficiency, is low in material loss, is good in yield, and is low in cost.

In winding processing, not only the base material film 11 used in the present invention but also layers such as the gas barrier layer 13 and the smoothing layer 15 have a very high level of flatness and smoothness, and, further, the film immediately after formation by a vacuum method such as CVD is highly active. Therefore, cockles occur in winding, and air is included to form a convex part (called a pyramid phenomenon by a person having ordinary skill in the art). As a result, sagging or strain or offset which is a phenomenon called blocking by a person having ordinary skill in the art in which the coating liquid on the front surface of the base material or the coating liquid on the back surface is transferred onto the opposite surface side, is much likely to occur. For this reason, also in the step of forming the base material or each layer, for winding handling, preferably, the end part is subjected to knurling treatment or treatment in which clean paper is inserted. In particular, this is very effective in the case of a construction in which a layer(s) is provided on both sides.

The gas barrier film 10 according to the present invention may be subjected to various treatments such as pretreatment, post treatment, or annealing. In the annealing treatment, the gas barrier film 10 may be held at a temperature of 100 to 230° C. for 10 to 180 min. The water vapor permeability and/or oxygen permeability can be reduced, for example, by recombination of dangling bond, or the effect of intrusion of the resin component in the smoothing layer and the stress relaxation layer into the gas barrier layer.

Regarding pretreatment, preferably, heat treatment or vacuum deaeration treatment is carried out before the gas barrier layer formation. For example, the gas barrier film may be held at a temperature of 100 to 230° C. for 10 to 180 min, or may be held at a temperature of 15 to 200° C. and 0.1 to 1000 hPa for 10 to 180 min. The pretreatment is carried out for developing a desired function by preventing such a phenomenon that, in the formation of the gas barrier layer, the residual coating liquid (solvent) contained, for example, in the smooth layer or stress relaxation layer is vaporized and is incorporated as an impurity in the film. Likewise, for impurity removal purposes, the provision of the step of cleaning before the formation of the gas barrier layer, the smoothing layer, the stress relaxation layer, and the anchor layer is preferred. Cleaning methods include ultrasonic cleaning, alkali cleaning, neutral detergent cleaning, plasma cleaning, and UV cleaning.

Regarding the post treatment, in aging treatment or the like after layer formation, for example, in the formation of the smoothing layer, when use is made of a sol-gel method in which the intrusion of the coating liquid is slow, storage at a temperature in the range of 25 to 100° C. for 1 to 14 days can reduce water vapor permeability and/or oxygen permeability.

Display Substrate

Further, as shown in FIG. 4, a display substrate may be produced by providing a transparent electrode layer and optionally an auxiliary electrode layer or other layer on the surface of the smoothing layer or the gas barrier layer. That is, a set of gas barrier layer/smoothing layer or a set of smoothing layer/gas barrier layer is indispensable. Other layer(s) may be provided or held between layers other than these layers.

Solar Battery

Further, the gas barrier film according to the present invention is also suitable for application to solar batteries where moisture resistance or content protection is necessary, for example, organic solar batteries and dye-sensitized solar batteries.

Display

When the gas barrier film 10 according to the present invention is used as a substrate 20 for a display, a layer(s) necessary in each display system may be stacked on any of front and back surfaces of the gas barrier film 10. In some cases, these layers are provided between the base material film and the gas barrier layer. Accordingly, the gas barrier film 10 according to the present invention include one wherein a layer for imparting a display function is interposed between the base material film and the thin film layer.

The gas barrier film 10 according to the present invention may be applied to various displays, and representative examples thereof include liquid crystal displays and organic EL element.

LCD

A liquid crystal display generally comprises two glass substrates each having on its inner side a transparent electrode and, further, an aligning layer and the like, and a liquid crystal held between the glass substrates the periphery of the assembly having been sealed. This display further comprises a color filter for colorization. The gas barrier film according to the present invention can be applied to the outer side of the glass substrate of the liquid crystal display. Alternatively, the gas barrier film 10 according to the present invention can be used instead of the glass substrate. In particular, when the two glass substrates are replaced with the gas barrier film 10 according to the present invention, a display the whole of which is flexible can be provided.

Some types of liquid crystals are optically anisotropic and cannot utilize PEN. In this case, the application of the gas barrier film becomes possible by avoiding the use of a polarizing plate or by varying the position of the liquid crystal layer. Examples of liquid crystals include plastic liquid crystals and polymer dispersed liquid crystals. Plastic liquid crystals are used for displays for personal digital assistants, communication equipment (portable telephones or cellular phones), notebook computers (PCs) or mobile equipment for amusement (handy games) and can realize a high level of function, for example, lightweight (about one-third of that of glass), thin type (about a half of that of glass), durability (about 10 times that of glass), high display capacitance, and parallax-free display (free from double images even in reflection mode) and can meet a demand for low power consumption involved in a size reduction in battery capacity. The polymer dispersion-type liquid crystal is aligned by applying an electric field to small particles of a liquid crystal dispersed in the polymer and is used as an optical shutter. Unlike TN liquid crystals, scattered-nonscattered state is used. Therefore, in principle, any polarizing plate is not required. Since the polarizing plate is unnecessary, the brightness is high. Additional advantages such as high image display operating speed, no need to provide the step of liquid crystal pouring, easy cell gap control, and no need to perform rubbing can be offered. Further, the polymer dispersion-type liquid crystal can also be applied to projection type.

Organic EL

An organic EL display again comprises two substrates each having on its inner side a transparent electrode and, held between the two substrates, an organic EL element layer, formed of, for example, a composite layer comprising a laminate of (a) a layer having an injection function, (b) a transport function, and (c) a luminescent function, the periphery of the assembly having been sealed. For example, a base material/gas barrier layer/smoothing layer/transparent electrically conductive layer/hole injection layer/hole transport layer/organic luminescent layer/electron injection layer/cathode may be mentioned as a basic construction. The present invention, however, is not limited to this construction. This organic EL display often includes a color filter for colorization or a plurality of other means (layer(s)). As with the case of the liquid crystal display, the gas barrier film 10 according to the present invention may be applied to the outer side of the glass substrate, or alternatively, the gas barrier film 10 according to the present invention may be used instead of the glass substrate. When the two glass substrates are replaced with the gas barrier film 10 according to the present invention, a display the whole of which is flexible can be provided. In particular, it should be noted that, since the organic EL element utilizes fluorescent emission, it is chemically unstable and has very low resistance to moisture and, thus, it is desirable for the organic EL element product has a high level of water vapor barrier properties. Also from the viewpoint of realizing reliable water vapor barrier properties in the laminate structure of the gas barrier film, for the gas barrier film, the use of a base material film having a deflection temperature under load of 150° C. or above and, in addition, a very low coefficient of moisture expansion or/and a very low coefficient of thermal expansion is preferred. A polyethylene naphthalate (PEN) film as a preferred base material film 11 according to the present invention has a deflection temperature under load of 155° C. and, at the same time, has a coefficient of thermal expansion of 8 ppm and a coefficient of moisture expansion of 0.5 ppm, that is, has high dimensional stability, and, thus, is most preferred.

Color Filter

A color filter comprises a patterned color conversion layer provided on a display substrate. The pattern layer is, for example, a single or plurality of types of color filter layers formed by patterning a resin film disposed on the base material film to form a desired pattern, or a laminate of such color filter layer and a color conversion layer. The color filter layer is preferably formed in one type or a plurality of types in a pattern form to constitute a pixel. For example, a red color filter layer, a green color filter layer, a blue color filter layer, and a black matrix layer provided between individual color filter layers (pixels) are sometimes formed. The pattern is generally formed by photolithography using a chemical such as an etching liquid. Therefore, the base material film should have chemical resistance. When the chemical resistance is low, the surface of the base material film undergoes damage such as denaturation. In this case, subsequently, a dense, high-adhesion gas barrier layer cannot be formed. Therefore, a high level of gas barrier properties cannot be developed. When a resin having a deflection temperature under load of 150° C. or above and a coefficient of linear expansion of preferably not more than 50 ppm/K, preferably polyethylenenaphthalate (PEN) is used, by virtue of its excellent heat resistance and chemical resistance, it is possible to form a dense and high-adhesion gas barrier layer which can realize a high level of gas barrier properties.

EXAMPLES

The following Examples and Comparative Examples further illustrate the present invention. However, the invention is not to be construed as being limited thereto.

Teonex film Q65 having a thickness of 100 μm of a deflection temperature under load of 155° C. (tradename; a polyethylene naphthalate film, manufactured by Teijin Ltd.) was provided as a base material film for Examples.

In Examples and Comparative Examples, a gas barrier layer was formed as follows.

SiOxNy, wherein x=0.7 and y=0.7, was placed in a film formation chamber of a magnetron sputtering apparatus, silicon nitride was provided as a target, and a gas barrier layer was provided to a silicon oxynitride film thickness of 100 nm under the following film formation conditions.

<Film Formation Conditions>
Film formation pressure: $2.5 \times 10^{-1}$ Pa
Flow rate of argon gas: 30 sccm
Flow rate of nitrogen gas: 20 sccm
Frequency of RF power supply: 13.56 MHz
Applied power: 1.2 kW SiOx, wherein x=1.7, was placed in a film formation chamber of an ion plating apparatus, silicon dioxide was provided as a target, and a gas barrier layer was provided to a silicon oxide film thickness of 100 nm under the following film formation conditions.

<Film Formation Conditions>
Film formation pressure: $2.7 \times 10^{-1}$ Pa
Flow rate of argon gas: 30 sccm
Flow rate of oxygen gas: 10 sccm
Frequency of RF power supply: 13.56 MHz
Applied power: 2.0 kW SiOx, wherein x=1.5, was placed in a film formation chamber of a pressure gradient-type ion plating apparatus with a return electrode, silicon dioxide was provided as a film forming material, and a gas barrier layer was provided to a silicon oxide film thickness of 100 nm under the following film formation conditions.

<Film Formation Conditions>
Film formation pressure: $8.0 \times 10^{-2}$ Pa
Flow rate of argon gas for plasma gas: 12 sccm
Applied current: 8.5 A
Applied voltage: 85 V
Applied power: 7.2 kW SiOxCz, wherein x=1.0 and z=1.0, was placed in a film formation chamber of a plasma CVD apparatus, HMDSO was provided as a starting gas, and a gas barrier layer was provided to a silicon oxycarbide film thickness of 100 nm under the following film formation conditions.

<Film Formation Conditions>
Film formation pressure: 6.6 Pa
Flow rate of argon gas: 10 sccm
Flow rate of oxygen gas: 30 sccm
Frequency of RF power supply: 13.56 MHz
Applied power: 1.8 kW The composition of the gas barrier layer was determined with a photoelectron spectroscopic analyzer (model number ESCA-LAB 220i-XL, manufactured by VG Scientific).

A smoothing layer of each of the Examples and Comparative Examples was formed as follows.

A sol-gel layer used as the smoothing layer is formed by spin coating a coating agent comprising an aminoalkyltrialkoxysilane as a main agent and drying the coating on a hot plate at 120° C. for 2 min and then in a drier at 160° C. for 1 hr to form a 1 μm-thick sol-gel layer (a smoothing layer).

A photoresist layer used as the smoothing layer is formed by spin coating a resist solution (CFPR CL-016S) manufactured by Tokyo Ohka Kogyo Co., Ltd. as a photoresist material and baking the coating at 120° C. for 30 min to form a 5 μm-thick uniform resist film (a smoothing layer).

A UV cured resin layer used as the smoothing layer is formed by coating a UV curable acrylate with a photopolymerization initiator (50 parts of pentaerythritol triacrylate, manufactured by Nippon Kayaku Co., Ltd. and 2 parts of Irgacure 184 (a polymerization initiator, manufactured by Ciba-Geigy)), drying the coating on a hot plate at 120° C. for 2 min, and then exposing the dried coating to ultraviolet light (UV) from a high pressure mercury lamp for UV curing to form a 2 μm-thick smoothing layer.

A cardo polymer layer used as a smoothing layer is formed by spin coating a coating agent V-259-EH (tradename, manufactured by Nippon Steel Chemical Co., Ltd.) comprising a cardo polymer as a main agent, drying the coating at 120° C. for 2 min, and further subjecting the coating to hot air drying at 160° C. for 60 min to form a 1.0 μm-thick smoothing layer.

Example 1

The following layers were formed on the above base material film under the above conditions to form a gas barrier film of Example 1 having a layer construction of base material film (PEN)/gas barrier layer (SiOxNy)/smoothing layer (sol-gel agent).

Example 2

The following layers were formed under the above conditions to form a gas barrier film having a layer construction of base material film (PEN)/gas barrier layer (SiOx; x=1.7)/smoothing layer (photoresist layer).

Example 3

The following layers were formed under the above conditions to form a gas barrier film having a layer construction of base material film (PEN)/gas barrier layer (SiOxCz)/smoothing layer (UV cured resin).

Example 4

The following layers were formed under the above conditions to form a gas barrier film having a layer construction of base material film (PEN)/gas barrier layer (SiOxNy)/smoothing layer (cardo polymer).

Example 5

The following layers were formed under the above conditions to form a gas barrier film having a layer construction of base material film (PEN)/gas barrier layer (SiOx; x=1.7)/smoothing layer (cardo polymer).

Example 6)

The following layers were formed under the above conditions to form a gas barrier film having a layer construction of base material film (PEN)/gas barrier layer (SiOxCz)/smoothing layer (cardo polymer).

Example 7

The following layers were formed under the above conditions to form a gas barrier film having a layer construction of base material film (PEN)/gas barrier layer (SiOxNy)/smoothing layer (cardo polymer)/gas barrier layer (SiOxNy).

Example 8

The following layers were formed under the above conditions to form a gas barrier film having a layer construction of base material film (PEN)/gas barrier layer (SiOxNy)/smoothing layer (cardo polymer)/gas barrier layer (SiOx; x=1.5).

Example 9

The following layers were formed under the above conditions to form a gas barrier film having a layer construction of base material film (PEN)/gas barrier layer (SiOxNy)/smoothing layer (cardo polymer)/gas barrier layer (SiOxCz).

Example 10

The following layers were formed under the above conditions to form a gas barrier film having a layer construction of base material film (PEN)/gas barrier layer (SiOx; x=1.7)/smoothing layer (cardo polymer)/gas barrier layer (SiOxNy).

Example 11

The following layers were formed under the above conditions to form a gas barrier film having a layer construction of base material film (PEN)/gas barrier layer (SiOx; x=1.7)/smoothing layer (cardo polymer)/gas barrier layer (SiOx).

Example 12

The following layers were formed under the above conditions to form a gas barrier film having a layer construction of base material film (PEN)/gas barrier layer (SiOx; x=1.7)/smoothing layer (cardo polymer)/gas barrier layer (SiOxCz).

Example 13

The following layers were formed under the above conditions to form a gas barrier film having a layer construction of base material film (PEN)/gas barrier layer (SiOxCz)/smoothing layer (cardo polymer)/gas barrier layer (SiOxNy).

Example 14

The following layers were formed under the above conditions to form a gas barrier film having a layer construction of base material film (PEN)/gas barrier layer (SiOxCz)/smoothing layer (cardo polymer)/gas barrier layer (SiOx; x=1.7).

Example 15

The following layers were formed under the above conditions to form a gas barrier film having a layer construction of base material film (PEN)/gas barrier layer (SiOxCz)/smoothing layer (cardo polymer)/gas barrier layer (SiOxCz).

Example 16

The following layers were formed under the above conditions to form a gas barrier film having a layer construction of smoothing layer (cardo polymer)/gas barrier layer (SiOxNy)/base material film (PEN)/gas barrier layer (SiOxNy)/smoothing layer (cardo polymer).

Example 17

The following layers were formed under the above conditions to form a gas barrier film having a layer construction of smoothing layer (cardo polymer)/gas barrier layer (SiOx; x=1.7)/base material film (PEN)/gas barrier layer (SiOx; x=1.7)/smoothing layer (cardo polymer).

Example 18

The following layers were formed under the above conditions to form a gas barrier film having a layer construction of gas barrier layer (SiOxNy)/smoothing layer (cardo polymer)/gas barrier layer (SiOxNy)/base material film (PEN)/gas barrier layer (SiOxNy)/smoothing layer (cardo polymer)/gas barrier layer (SiOxNy).

Example 19

The following layers were formed under the above conditions to form a gas barrier film having a layer construction of gas barrier layer (SiOx; x=1.7)/smoothing layer (cardo polymer)/gas barrier layer (SiOxNy)/base material film (PEN)/gas barrier layer (SiOxNy)/smoothing layer (cardo polymer)/gas barrier layer (SiOx; x=1.7).

Example 20

The following layers were formed under the above conditions to form a gas barrier film having a layer construction of gas barrier layer (SiOxCz)/smoothing layer (cardo polymer)/gas barrier layer (SiOxNy)/base material film (PEN)/gas barrier layer (SiOxNy)/smoothing layer (cardo polymer)/gas barrier layer (SiOxCz).

Example 21

The following layers were formed under the above conditions to form a gas barrier film having a layer construction of gas barrier layer (SiOxNy)/smoothing layer (cardo polymer)/gas barrier layer (SiOx; x=1.7)/base material film (PEN)/gas barrier layer (SiOx; x=1.7)/smoothing layer (cardo polymer)/gas barrier layer (SiOxNy).

Example 22

The following layers were formed under the above conditions to form a gas barrier film having a layer construction of gas barrier layer (SiOx; x=1.7)/smoothing layer (cardo polymer)/gas barrier layer (SiOx; x=1.7)/base material film (PEN)/gas barrier layer (SiOx; x=1.7)/smoothing layer (cardo polymer)/gas barrier layer (SiOx; x=1.7).

Example 23

The following layers were formed under the above conditions to form a gas barrier film having a layer construction of gas barrier layer (SiOxCz)/smoothing layer (cardo polymer)/gas barrier layer (SiOxCz)/base material film (PEN)/gas barrier layer (SiOx; x=1.7)/smoothing layer (cardo polymer)/gas barrier layer (SiOxCz).

Example 24

The following layers were formed under the above conditions to form a gas barrier film having a layer construction of gas barrier layer (SiOxNy)/smoothing layer (cardo polymer)/gas barrier layer (SiOxCz)/base material film (PEN)/gas barrier layer (SiOxCz)/smoothing layer (cardo polymer)/gas barrier layer (SiOxNy).

Example 25

The following layers were formed under the above conditions to form a gas barrier film having a layer construction of gas barrier layer (SiOx; x=1.7)/smoothing layer (cardo polymer)/gas barrier layer (SiOxCz)/base material film (PEN)/gas barrier layer (SiOxCz)/smoothing layer (cardo polymer)/gas barrier layer (SiOx; x=1.7).

Example 26

The following layers were formed under the above conditions to form a gas barrier film having a layer construction of gas barrier layer (SiOxCz)/smoothing layer (cardo polymer)/gas barrier layer (SiOxCz)/base material film (PEN)/gas barrier layer (SiOxCz)/smoothing layer (cardo polymer)/gas barrier layer (SiOxCz).

Example 27

The following layers were formed on the above base material film under the above conditions to form a gas barrier film having a layer construction of base material film (PEN)/gas barrier layer (SiOx; x=1.5)/smoothing layer (sol-gel agent).

Example 28

The following layers were formed under the above conditions to form a gas barrier film having a layer construction of base material film (PEN)/gas barrier layer (SiOx; x=1.5)/smoothing layer (photoresist layer).

Example 29

The following layers were formed under the above conditions to form a gas barrier film having a layer construction of base material film (PEN)/gas barrier layer (SiOx; x=1.5)/smoothing layer (UV cured resin).

Example 30

The following layers were formed under the above conditions to form a gas barrier film having a layer construction of base material film (PEN)/gas barrier layer (SiOx; x=1.5)/smoothing layer (cardo polymer).

Example 31

The following layers were formed under the above conditions to form a gas barrier film having a layer construction of base material film (PEN)/gas barrier layer (SiOx; x=1.5)/smoothing layer (cardo polymer)/gas barrier layer (SiOx; x=1.5).

Example 32

The following layers were formed under the above conditions to form a gas barrier film having a layer construction of gas barrier layer (SiOx; x=1.5)/smoothing layer (cardo polymer)/gas barrier layer (SiOx; x=1.5)/base material film (PEN)/gas barrier layer (SiOx; x=1.5)/smoothing layer (cardo polymer)/gas barrier layer (SiOx; x=1.5).

Example 33

A transparent electrode (indium zinc oxide) film was formed by sputtering on the whole surface of the gas barrier layer (SiOzNy) in the gas barrier film of Example 7. A resist agent "OFRP-800" (tradename, manufactured by Tokyo Ohka Kogyo Co., Ltd.) was coated on this indium zinc oxide, and patterning was then carried out by photolithography to form a transparent electrode layer with a stripe pattern having a width of 0.094 mm, a spacing of 0.016 mm, and a film thickness of 100 nm at positions corresponding to fluorescence conversion layers of respective colors. Thus, a display substrate of Example 33 having a layer construction of base material film (PEN)/gas barrier layer (SiOzNy)/smoothing layer (cardo polymer)/gas barrier layer (SiOzNy)/transparent electrode layer (ITO) was prepared.

The properties of the display substrate thus obtained were evaluated. As a result, it was found that the display substrate had a water vapor permeability of not more than 0.01 g/m²·day and an oxygen permeability of not more than 0.01 cc/m²·day·atm, that is, satisfactory gas barrier properties, and, at the same time, underwent no significant elongation and deflection.

Example 34

A display substrate was formed in the same manner as in Example 33, except that a transparent electrode layer was formed on the surface of the gas barrier layer (SiOx; x=1.5) in the gas barrier film prepared in Example 32. The properties of the display substrate thus obtained were evaluated. As a result, it was found that the display substrate had a water vapor permeability of not more than 0.01 g/m²·day and an oxygen permeability of not more than 0.01 cc/m²·day·atm, that is, satisfactory gas barrier properties, and, at the same time, underwent no significant elongation and deflection.

Example 35

(1) Formation of Blue Color Filter Layer

A polyethylene naphthalate (PEN) film (30 cm×21 cm) having a deflection temperature under load of 155° C. and a thickness of 200 μm was provided as a transparent support substrate 11.

A blue filter material (Color Mosaic CB-7001: tradename, manufactured by Fuji-Hunt Electronics Technology Co., Ltd.) was spin coated onto the polyethylene naphthalate (PEN) film. The coating was patterned by photolithography to form a blue color filter layer with a stripe pattern having a line width of 0.1 mm, a pitch (cycle) of 0.33 mm, and a film thickness of 6 μm.

(2) Formation of Green Conversion Layer

Coumarin 6 as a fluorescent dye (0.7 part by mass) was dissolved in 120 parts by mass of propylene glycol monoethyl acetate (PEGMA) as a solvent. 100 parts by mass of "V259 PA/P5" (tradename, manufactured by Nippon Steel Chemical Co., Ltd.) as a photopolymerizable resin was added to and dissolved in the solution to prepare a coating solution.

A coating solution prepared above was spin coated on the transparent support substrate with a blue color filter layer formed thereon prepared in the above step, and the coating was patterned by photolithography to form a green conversion layer with a stripe pattern having a line width of 0.1 mm, a pitch (cycle) of 0.33 mm, and a film thickness of 10 μm.

(3) Formation of Red Conversion Layer

Coumarin 6 (0.6 part by mass), Rhodamine 6G (0.3 part by mass), and Basic Violet 11 (0.3 part by mass) as fluorescent dyes were dissolved in 120 parts by mass of propylene glycol monoethyl acetate (PEGMA) as a solvent. 100 parts by mass of "V259 PA/P5" (tradename, manufactured by Nippon Steel Chemical Co., Ltd.) as a photopolymerizable resin was added to and dissolved in the solution to prepare a coating solution.

The coating solution prepared above was spin coated onto the transparent support substrate with a blue color filter layer and a green conversion layer formed thereon, and the coating was patterned by photolithography to form a red conversion layer with a stripe pattern having a line width of 0.1 mm, a pitch (cycle) of 0.33 mm, and a film thickness of 10 μm.

The line patterns of the red conversion layer, the green conversion layer, and the blue color filter layer formed above were arranged parallel to one another in an inter-line width of 0.01 mm. The red conversion layer, the green conversion layer, and the blue color filter layer correspond to a pattern layer 13.

(4) Formation of Gas Barrier Layer and Smoothing Layer

Gas barrier layer/smoothing layer/gas barrier layer were formed in that order on the surface of the color conversion layers formed in the above step in the same manner as in Example 7.

(5) Formation of Transparent Electrode Layer

A transparent electrode (indium zinc oxide) film was formed by sputtering on the whole surface of the smoothing layer. A resist agent "OFRP-800" (tradename, manufactured by Tokyo Ohka Kogyo Co., Ltd.) was coated onto the indium zinc oxide, and the coating was then patterned by photolithography to form a transparent electrode layer with a stripe pattern having a width of 0.094 mm, a spacing of 0.016 mm, and a film thickness of 100 nm at positions corresponding to fluorescence conversion layers of respective colors. Thus, a color conversion filter substrate having a layer construction of substrate film (PEN)/pattern layer/gas barrier layer (SiOxNy)/smoothing layer (cardo polymer)/gas barrier layer (SiOxNy)/transparent electrode layer (ITO) was prepared.

(6) Formation of Organic EL-associated Layers

The color conversion filter substrate with a transparent electrode layer formed thereon was placed in a resistance heating type vapor deposition apparatus, and a hole injection layer, a hole transport layer, an organic luminescent layer, and an electron injection layer were successively formed on the whole surface of the underlying layer without breaking vacuum. In the film formation, the internal pressure in the vacuum chamber was reduced to $1\times10^{-4}$ Pa. The hole injection layer was formed by stacking copper phthalocyanine (CuPc) to a film thickness of 100 nm. The hole transport layer was formed by stacking 4,4'-bis[N-(1-naphthyl)-N-phenylamino]biphenyl (α-NPD) to a film thickness of 20 nm. The organic luminescent layer was formed by stacking 4,4'-bis(2,2'-diphenylvinyl)biphenyl (DPVBi) to a film thickness of 30 nm. The electron injection layer was formed by stacking aluminum chelate (tris(8-hydroxyquinoline) aluminum complex, Alq) to a film thickness of 20 nm.

Next, without breaking vacuum, a cathode of a 200 nm-thick Mg/Ag (mass ratio 10/1) layer was formed using a mask for the formation of a pattern having a width of 0.30 mm and a spacing of 0.03 mm orthogonal to the stripe pattern of the anode (transparent electrode layer). The organic EL luminescent element thus obtained was placed in a glove box having a dry nitrogen atmosphere (oxygen concentration and moisture concentration: each not more than 10 ppm) where the organic EL luminescent element was sealed with seal glass and a UV curable adhesive, whereby an organic EL color display of Example 35 having a layer construction of base material film/pattern layer/gas barrier layer/smoothing layer/transparent electrode layer/hole injection layer/hole transport layer/organic luminescent layer/electron injection layer/cathode was prepared.

This organic EL color display was continuously driven for 100 hr. As a result, good display was realized without any problem.

Example 36

An organic EL color display was prepared in the same manner as in Example 35, except that the gas barrier layer and the smoothing layer were formed in the same manner as in Example 32.

This organic EL color display was continuously driven for 500 hr. As a result, good display was realized without causing any dark spot.

Comparative Example 1

A gas barrier film was prepared in the same manner as in Example 4, except that a 200 μm-thick polyethylene terephthalate (PET) resin film having a deflection temperature under load of 120° C. (manufactured by Toyobo Co., Ltd.) was used as the base material film.

Evaluation

For the gas barrier film and the organic EL element comprising a layer construction of transparent electrode layer/hole injection layer/hole transport layer/organic luminescent layer/electron injection layer/cathode provided on the gas barrier film, the water vapor permeability and the oxygen permeability were measured by the following methods for evaluation. The results are shown in Table 1.

The water vapor permeability was measured with a water vapor permeability measuring apparatus (PERMATRAN-W 3/31: tradename, manufactured by MOCON) under conditions of measuring temperature 37.8° C. and humidity 100% Rh. The detection limit is 0.01 g/m$^2$·day, and, when the water vapor permeability is below the detection limit, the water vapor permeability is expressed to be not more than 0.01 g/m$^2$·day.

The oxygen permeability was measured with an oxygen gas permeability measuring apparatus (OX-TRAN 2/20: tradename, manufactured by MOCON) under conditions of measuring temperature 23° C. and humidity 90% Rh. The detection limit is 0.01 cc/m$^2$·day·atm, and, when the oxygen gas permeability is below the detection limit, the oxygen gas permeability is expressed as not more than 0.01 cc/m$^2$·day·atm.

|  |  | Gas barrier film form | | Organic EL element form | |
|---|---|---|---|---|---|
| Item | | Water vapor permeability | Oxygen permeability | Water vapor permeability | Oxygen permeability |
| Ex. | 1 | Not more than 0.01 | 0.02 | Not more than 0.01 | 0.02 |
|  | 2 | Not more than 0.01 | 0.02 | Not more than 0.01 | 0.02 |
|  | 3 | Not more than 0.01 | 0.02 | Not more than 0.01 | 0.02 |
|  | 4 | Not more than 0.01 | 0.02 | Not more than 0.01 | 0.02 |
|  | 5 | Not more than 0.01 | 0.02 | Not more than 0.01 | 0.02 |
|  | 6 | Not more than 0.01 | 0.02 | Not more than 0.01 | 0.02 |
|  | 7 | Not more than 0.01 | Not more than 0.01 | Not more than 0.01 | Not more than 0.01 |
|  | 8 | Not more than 0.01 | Not more than 0.01 | Not more than 0.01 | Not more than 0.01 |
|  | 9 | Not more than 0.01 | Not more than 0.01 | Not more than 0.01 | Not more than 0.01 |
|  | 10 | Not more than 0.01 | Not more than 0.01 | Not more than 0.01 | Not more than 0.01 |
|  | 11 | Not more than 0.01 | Not more than 0.01 | Not more than 0.01 | Not more than 0.01 |
|  | 12 | Not more than 0.01 | Not more than 0.01 | Not more than 0.01 | Not more than 0.01 |
|  | 13 | Not more than 0.01 | Not more than 0.01 | Not more than 0.01 | Not more than 0.01 |
|  | 14 | Not more than 0.01 | Not more than 0.01 | Not more than 0.01 | Not more than 0.01 |
|  | 15 | Not more than 0.01 | Not more than 0.01 | Not more than 0.01 | Not more than 0.01 |
|  | 16 | Not more than 0.01 | Not more than 0.01 | Not more than 0.01 | Not more than 0.01 |
|  | 17 | Not more than 0.01 | Not more than 0.01 | Not more than 0.01 | Not more than 0.01 |
|  | 18 | Not more than 0.01 | Not more than 0.01 | Not more than 0.01 | Not more than 0.01 |
|  | 19 | Not more than 0.01 | Not more than 0.01 | Not more than 0.01 | Not more than 0.01 |
|  | 20 | Not more than 0.01 | Not more than 0.01 | Not more than 0.01 | Not more than 0.01 |
|  | 21 | Not more than 0.01 | Not more than 0.01 | Not more than 0.01 | Not more than 0.01 |
|  | 22 | Not more than 0.01 | Not more than 0.01 | Not more than 0.01 | Not more than 0.01 |
|  | 23 | Not more than 0.01 | Not more than 0.01 | Not more than 0.01 | Not more than 0.01 |
|  | 24 | Not more than 0.01 | Not more than 0.01 | Not more than 0.01 | Not more than 0.01 |
|  | 25 | Not more than 0.01 | Not more than 0.01 | Not more than 0.01 | Not more than 0.01 |
|  | 26 | Not more than 0.01 | Not more than 0.01 | Not more than 0.01 | Not more than 0.01 |
|  | 27 | Not more than 0.01 | Not more than 0.01 | Not more than 0.01 | Not more than 0.01 |
|  | 28 | Not more than 0.01 | Not more than 0.01 | Not more than 0.01 | Not more than 0.01 |
|  | 29 | Not more than 0.01 | Not more than 0.01 | Not more than 0.01 | Not more than 0.01 |
|  | 30 | Not more than 0.01 | Not more than 0.01 | Not more than 0.01 | Not more than 0.01 |
|  | 31 | Not more than 0.01 | Not more than 0.01 | Not more than 0.01 | Not more than 0.01 |
|  | 32 | Not more than 0.01 | Not more than 0.01 | Not more than 0.01 | Not more than 0.01 |
| Comp. Ex. | 1 | Not more than 0.01 | 0.02 | 1.0 | 1.0 |

Note)
Unit: water vapor permeability in g/m$^2$ · day, and oxygen permeability in cc/m$^2$ · day · atm Evaluation Results For all the gas barrier films prepared in Examples 1 to 3, the water vapor permeability was not more than 0.01 g/m$^2$·day, and the oxygen permeability was 0.02 cc/m$^2$·day·atm, indicating that these gas barrier films had satisfactory gas barrier properties. Further, they suffered from no significant elongation and deflection.

For all the gas barrier films prepared in Examples 4 to 6, the water vapor permeability was not more than 0.01 g/m$^2$·day, and the oxygen permeability was 0.02 cc/m$^2$·day·atm, indicating that these gas barrier films had satisfactory gas barrier properties. Further, they suffered from no significant elongation and deflection.

For all the gas barrier films prepared in Examples 7 to 32, the water vapor permeability was not more than 0.01 g/m$^2$·day, and the oxygen permeability was not more than 0.01 cc/m$^2$·day·atm, indicating that these gas barrier films had satisfactory gas barrier properties. Further, they suffered from no significant elongation and deflection.

The gas barrier films of Examples 1 to 6 and 8 to 32 were brought to organic EL elements in the same manner as in Example 35 which were then measured for water vapor permeability and oxygen permeability. As a result, as shown in Table 1, the organic EL elements caused no deterioration and had satisfactory gas barrier properties and, at the same time, suffered from no significant elongation and deflection.

The properties of the gas barrier film of Comparative Example 1 were evaluated. As a result, the water vapor permeability was not more than 0.01 g/m$^2$ day, and the oxygen permeability was 0.02 cc/m$^2$·day·atm, indicating that the gas barrier properties were on the same level as those of Examples 4 to 6. However, when a transparent electrode layer and a group of layers constituting organic EL element were coated onto the gas barrier film in the same manner as in Example 35 and the assembly was dried at 180° C. for 6 hr followed by evaluation of properties of the gas barrier film, it was found that the oxygen permeability and the water vapor permeability were significantly deteriorated and 1.0 cc/m$^2$·day·atm and 1.0 g/m$^2$·day, respectively, indicating that the assembly cannot be used as an organic EL element.

The invention claimed is:

1. A gas barrier film comprising:
   a base material film having a deflection temperature under load of 150° C. or above; and
   at least one of (i) a gas barrier layer and a smoothing layer in that order, and (ii) a smoothing layer and a gas barrier layer in that order, provided on the base material film;
   wherein the smoothing layer comprises a cardo polymer.

2. The gas barrier film according to claim 1, wherein said base material film is formed of polyethylene naphthalate.

3. The gas barrier film according to claim 1, wherein the gas barrier layer is formed of one of an inorganic oxide, an inorganic oxynitride, an inorganic oxycarbide, and an inorganic oxycarbonitride.

4. The gas barrier film according to claim 1, wherein the smoothing layer has an acryl structure.

5. The gas barrier film according to claim 1, wherein at least one stress relaxation layer is provided on at least one side of the base material film.

6. The gas barrier film according to claim 1, wherein a transparent electrically conductive film is provided on a surface of one of the gas barrier layer and the smoothing layer.

7. A display substrate comprising a gas barrier film according to claim 1.

8. A display comprising a display substrate according to claim 7.

9. An organic electroluminescent element comprising a display substrate according to claim 7.

10. A liquid crystal display device comprising a display substrate according to claim 7.

11. A display substrate comprising a transparent electrically conductive film provided on a surface of one of the gas barrier layer and the smoothing layer in a gas barrier film according to claim 1.

12. A display substrate comprising an auxiliary electrode layer provided on a surface of the transparent electrically conductive film in a display substrate according to claim 11.

13. A color filter comprising a display substrate according to claim 11.

14. A display comprising a color filter according to claim 13.

15. An organic EL element comprising a color filter according to claim 13.

16. A gas barrier film comprising:
    a base material film having a deflection temperature under load of 150° C. or above; and
    at least one of i) a gas barrier layer and a smoothing layer in that order, and (ii) a smoothing layer and a gas barrier layer in that order, provided on the base material film;
    wherein the smoothing layer is a coating film of a coating composition using as starting materials at least a silane coupling agent containing an organic functional group and a hydrolyzable group and a crosslinkable compound containing an organic functional group reactive with the organic functional group contained in the silane coupling agent.

* * * * *